United States Patent
Luo et al.

(10) Patent No.: US 11,258,463 B2
(45) Date of Patent: Feb. 22, 2022

(54) POLAR CODE TRANSMISSION METHOD AND APPARATUS

(71) Applicant: Huawei Technologies Co., Ltd., Shenzhen (CN)

(72) Inventors: Hejia Luo, Hangzhou (CN); Gongzheng Zhang, Hangzhou (CN); Jian Wang, Hangzhou (CN); Rong Li, Hangzhou (CN); Yourui HuangFu, Hangzhou (CN); Huazi Zhang, Hangzhou (CN); Ying Chen, Hangzhou (CN); Jun Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/673,581

(22) Filed: Nov. 4, 2019

(65) Prior Publication Data
US 2020/0067536 A1  Feb. 27, 2020

Related U.S. Application Data

(63) Continuation of application No. PCT/CN2018/085711, filed on May 4, 2018.

(30) Foreign Application Priority Data

May 5, 2017 (CN) .......................... 201710314206.5

(51) Int. Cl.
*H03M 13/00* (2006.01)
*H03M 13/27* (2006.01)
*H03M 13/13* (2006.01)

(52) U.S. Cl.
CPC ....... *H03M 13/2792* (2013.01); *H03M 13/13* (2013.01); *H03M 13/616* (2013.01)

(58) Field of Classification Search
CPC . H03M 13/2792; H03M 13/13; H03M 13/616
See application file for complete search history.

(56) References Cited

U.S. PATENT DOCUMENTS

| 2009/0187804 A1 | 7/2009 | Shen et al. |
| 2011/0216857 A1 | 9/2011 | Gotman et al. |

(Continued)

FOREIGN PATENT DOCUMENTS

| CN | 102122966 A | 7/2011 |
| CN | 102299735 A | 12/2011 |

(Continued)

OTHER PUBLICATIONS

"Polar Codes for Control Channels," Agenda item: 8.1.3.1, Source: Nokia, Alcatel-Lucent Shanghai Bell, Document for: Discussion and Decision, 3GPP TSG-RAN WG1 #86bis, R1-1609590, Lisbon, Portugal, Oct. 10-14, 2016, 14 pages.

(Continued)

*Primary Examiner* — Samir W Rizk
(74) *Attorney, Agent, or Firm* — Slater Matsil, LLP

(57) ABSTRACT

A polar code transmission method and apparatus, the method including performing, by a transmit end, polar code encoding on at least one of to-be-encoded bit sequences U to generate an encoded sequence, wherein a length of U is N, and scrambling and interleaving, by the transmit end, the encoded sequence by using a scrambling sequence $S_X$ and an interleaving matrix $P_X$.

17 Claims, 18 Drawing Sheets

(56) References Cited

U.S. PATENT DOCUMENTS

| | | | |
|---|---|---|---|
| 2014/0169492 A1 | 6/2014 | Mahdavifar et al. | |
| 2016/0182187 A1* | 6/2016 | Kim | H04L 1/1861 714/807 |
| 2017/0012739 A1 | 1/2017 | Shen et al. | |
| 2017/0338996 A1* | 11/2017 | Sankar | H04L 1/0058 |
| 2018/0198555 A1* | 7/2018 | Wu | H04L 1/0009 |
| 2019/0215720 A1 | 7/2019 | Li et al. | |
| 2019/0319745 A1* | 10/2019 | Pan | H04L 5/0053 |
| 2020/0083984 A1* | 3/2020 | Shen | H04L 1/02 |

FOREIGN PATENT DOCUMENTS

| | | |
|---|---|---|
| CN | 105850059 A | 8/2016 |
| CN | 107835063 A | 3/2018 |
| WO | 2017177899 A1 | 10/2017 |
| WO | 2018176495 A1 | 10/2018 |

OTHER PUBLICATIONS

"Details of the Polar Code Design," Agenda Item: 7 1.5.1, Source: Huawei, HiSilicon, Document for: Discussion and Decision, 3GPP TSG RAN WG1 Meeting #87, R1-1611254, Reno, USA, Nov. 10-14, 2016, 15 pages.

"Comparison of Polar and LDPC with Short Information Length for eMBB Scenario," Agenda Item: 7.1.5.1, Source: Spreadtrum Communications, Document for: Discussion and decision, 3GPP TSG RAN WG1 meeting #87 R1-1611478, Reno, USA, Nov. 14-18, 2016, 4 pages.

"Polar Codes for Control Channels," Agenda item: 7.1.5.1, Source: Nokia, Alcatel-Lucent Shanghai Bell, Document for: Discussion and Decision, 3GPP TSG-RAN WG1 #87, R1-1612284, Reno, U.S.A., Nov. 14-18, 2016, 14 pages.

"Interleaver for Polar Codes," Agenda Item: 7.1.5.1, Source: InterDigital Communications, Document for: Discussion and Decision, 3GPP TSG RAN WG1 Meeting #87, R1-1612656, Reno, USA Nov. 14-18, 2016, 5 pages.

Sayed, M.A.M. et al., "A Novel Scrambler Design for Enhancing Secrecy Transmission Based on Polar Code," IEEE Communications Letters, vol. 21, No. 8, Aug. 2017, 4 pages.

Lei, N., "Research on Algorithms of Encoding and Decoding for Polar Codes and Implementation of the Decoding Algorithm on FPGA." Harbin Institute of Technology, 2017, 1 page (English Abstract).

* cited by examiner

|   |   |   |   |   |   |   |   |
|---|---|---|---|---|---|---|---|
| 1 | 0 | 0 | 0 | 0 | 0 | 0 | 1 |
| 0 | 1 | 0 | 0 | 0 | 0 | 0 | 0 |
| 0 | 0 | 1 | 0 | 0 | 0 | 0 | 0 |
| 0 | 0 | 0 | 1 | 0 | 0 | 0 | 0 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |

FIG. 14b

|   |   |   |   |   |   |   |   |
|---|---|---|---|---|---|---|---|
| 1 | 0 | 0 | 1 | 0 | 0 | 0 | 1 |
| 0 | 1 | 0 | 0 | 0 | 1 | 0 | 0 |
| 0 | 0 | 1 | 0 | 0 | 0 | 1 | 0 |
| 0 | 0 | 0 | 1 | 0 | 0 | 0 | 1 |
| 0 | 0 | 0 | 0 | 1 | 0 | 0 | 0 |
| 0 | 0 | 0 | 0 | 0 | 1 | 0 | 0 |
| 0 | 0 | 0 | 0 | 0 | 0 | 1 | 0 |
| 0 | 0 | 0 | 0 | 0 | 0 | 0 | 1 |

FIG. 14c

POLAR CODE TRANSMISSION METHOD AND APPARATUS

CROSS-REFERENCE TO RELATED APPLICATIONS

This application is a continuation of International Patent Application No. PCT/CN2018/085711, filed on May 4, 2018, which claims priority to Chinese Patent Application No. 201710314206.5, filed on May 5, 2017, the disclosures of the aforementioned applications are hereby incorporated by reference in their entireties.

TECHNICAL FIELD

Embodiments of this application relate to the field of communications technologies, and in particular, to a polar code transmission method and apparatus.

BACKGROUND

In a long term evolution (LTE) system, a physical broadcast channel (PBCH) carries a master information block (MIB). A length of the MIB is 24 bits, and the MIB includes content such as a downlink system bandwidth, a physical hybrid automatic repeat request indicator channel (PHICH) size, and eight most significant bits of a system frame number (SFN). FIG. 1 shows a PBCH processing process at a transmit end. First, a base station performs cyclic redundancy check (CRC) encoding on a to-be-sent MIB to obtain a CRC sequence of 16 bits. Then, the base station performs channel encoding and rate matching on a sequence of 40 bits (including an MIB of 24 bits and the 16-bit CRC) to obtain an encoded sequence, replicates the encoded sequence to obtain four independent PBCH units of an equal size, where all the independent PBCH units carry same data, and scrambles the four independent PBCH units respectively by using four scrambling code sequences. Finally, the base station completes subsequent modulation, mapping, and sending procedures after scrambling.

During PBCH channel encoding, tailing biting convolution coding (TBCC) is used, and different phases are used for the four scrambling code sequences. The four independent PBCH units carry a same coded bit. After procedures such as scrambling, modulation, and mapping are performed on the four independent PBCH units, the four independent PBCH units are sent at a time interval of 40 ms (a transmission time of four radio frames, and each radio frame is 10 ms).

FIG. 2 shows a PBCH processing process at a receive end. It can be learned from the descriptions of the transmit end that the four independent PBCH units carry the same coded bit. Therefore, when channel quality is sufficiently good, the receive end successfully completes descrambling, decoding, and CRC check operations by receiving only one independent PBCH unit within 40 ms. By using a successfully descrambled scrambling code sequence, the receive end obtains a sequence number of a radio frame in which the transmit end sends an MIB within 40 ms, in other words, learns of two least significant bits of an SFN. When channel quality is relatively poor, if the receive end cannot successfully perform descrambling and decoding by receiving only one independent PBCH unit, the receive end performs soft combination on the received independent PBCH unit and an independent PBCH unit that is sent within next 10 ms, and then performs decoding until decoding succeeds.

A 5th generation (5G) communications technology or a follow-up communications technology is quite different from a 4G communications technology. Therefore, a new solution is needed because a PBCH encoding/decoding manner in LTE cannot continue to be used.

SUMMARY

Embodiments of this application provide a polar code transmission method and apparatus, to apply a polar code encoding mode to a PBCH.

Specific technical solutions provided in the embodiments of this application are as follows.

According to a first aspect, a polar code transmission method is provided. A transmit end scrambles and interleaves an encoded sequence obtained after polar code encoding, thereby avoiding timing confusion caused because polar codes sent at different timing are the same when a to-be-encoded bit sequence is an all-o vector, and helping a polar code encoding mode be better applied to a PBCH.

In a possible design, the transmit end performs polar code encoding on some or all of to-be-encoded bit sequences U to generate an encoded sequence, where a length of U is N, and the transmit end scrambles and interleaves the encoded sequence by using a scrambling sequence $S_X$ and an interleaving matrix $P_X$.

In a possible design, a mother code length is N, and the length of U is the same as the mother code length. If a bit at an $(N/2)^{th}$ location in U is an information bit, and the bit at the $(N/4)^{th}$ location in U is a fixed bit, bits at a first location to an $(N/2)^{th}$ location in $S_X$ are set to 1, or if a bit at an $(N/4)^{th}$ location in U is a fixed bit, and $S_X = S_U \cdot G_N$, where $G_N$ is a generator matrix of a polar code, and Su is a 1×N vector, a bit that is in Su and that corresponds to a first information bit location in U is set to 1, or if $S_X = S_U \cdot G_N$, and $G_N \cdot P_X \cdot G_N = T_u$, where $G_N$ is a generator matrix of a polar code, Su is a 1×N vector, and $T_u$ is a transformation matrix, column vectors that are in $T_u$ and that correspond to information bit locations in U constitute an information bit transformation matrix, and a bit that is in Su and that corresponds to a location of a row in Tu is set to 1, where the row has a largest row weight in an M×M upper triangular matrix in the information bit transformation matrix, and M is a positive integer greater than or equal to 2. In this way, a case in which implicit information carried in different transmission versions cannot be correctly detected by a receive end when the to-be-encoded bit sequence is an all-o vector can be effectively avoided through $S_X$ scrambling.

In a possible design, a mother code length is d×N, the to-be-encoded sequences form d parts of an equal length, U is any one of the d parts, and d is an exponential power of 2. If a bit at an $(N/2)^{th}$ location in U is an information bit, and the bit at the $(N/4)^{th}$ location in U is a fixed bit, a bit at an $(N/4)^{th}$ location in Su is set to 1, or if a bit at an $(N/4)^{th}$ location in U is a fixed bit, and $S_X = S_U \cdot G_N$, where $G_N$ is a generator matrix of a polar code, and Su is a 1×N vector, a bit that is in Su and that corresponds to a first information bit location in U is set to 1, or if $S_X = S_U \cdot G_N$, and $G_N \cdot P_X \cdot G_N = T_u$, $G_N$, where $G_N$ is a generator matrix of a polar code, Su is a 1×N vector, and $T_u$ is a transformation matrix, column vectors that are in $T_u$ and that correspond to information bit locations in U constitute an information bit transformation matrix, and a bit that is in Su and that corresponds to a location of a row in Tu is set to 1, where the row has a largest row weight in an M×M upper triangular matrix in the information bit transformation matrix, and M is a positive integer greater than or equal to 2.

In a possible design, the transmit end first scrambles and then interleaves the encoded sequence, or the transmit end first interleaves and then scrambles the encoded sequence.

In a possible design, if there are at least two M×M upper triangular matrices in the information bit transformation matrix, a bit that is in Su and that corresponds to a location of a row in Tu is set to 1, where the row has a largest row weight in at least one M×M upper triangular matrix.

In a possible design, the interleaving matrix is a permutation matrix, and optionally, the interleaving matrix is a cyclic shift matrix.

According to a second aspect, a polar code transmission method is provided. A transmit end performs polar code encoding on some or all of to-be-encoded bit sequences U to generate an encoded sequence, where a length of U is N, and the transmit end interleaves the encoded sequence by using an interleaving matrix $P_X$. A fixed bit at a specific location in U is set to 1.

In a possible design, if a bit at an $(N/2)^{th}$ location in U is a fixed bit, the fixed bit at the $(N/2)^{th}$ location in U is set to 1, or if a bit at an $(N/2)^{th}$ location in U is an information bit, and a bit at an $(N/4)^{th}$ location in U is a fixed bit, the bit at the $(N/4)^{th}$ location in U is set to 1, or if a sequence number of a first information bit in U is greater than N/4, a fixed bit at an $(N/4)^{th}$ location sorted before the first information bit in U in a natural polar code order is set to 1, or column vectors that are in $T_u$ and that correspond to information bit locations in U constitute an information bit transformation matrix, a row of a largest row weight in an M×M upper triangular matrix in the information bit transformation matrix corresponds to a location index in U, and if an $(N/4)^{th}$ bit sorted before the location index in U in a natural polar code order is a fixed bit, the $(N/4)^{th}$ fixed bit sorted before the location index in U in the natural polar code order is set to 1, where M is a positive integer greater than or equal to 2. Optionally, if there are at least two M×M upper triangular matrices in the information bit transformation matrix, at least one M×M upper triangular matrix is selected to perform the foregoing processing.

In a possible design, the interleaving matrix is a permutation matrix, and optionally, the interleaving matrix is a cyclic shift matrix.

According to a third aspect, a polar code transmission apparatus is provided. The apparatus has functions of implementing behavior of the transmit end in the foregoing first aspect and any possible design of the first aspect. The functions may be implemented by hardware, or may be implemented by hardware executing corresponding software. The hardware or the software includes one or more modules corresponding to the foregoing functions.

In a possible design, when some or all of the functions are implemented by hardware, the polar code transmission apparatus includes an input interface circuit, configured to obtain some or all of bit sequences U, a logic circuit, configured to perform behavior of the transmit end in the foregoing first aspect and any possible design of the first aspect, and an output interface circuit, configured to output a scrambled and interleaved bit sequence.

Optionally, the polar code transmission apparatus may be a chip or an integrated circuit.

In a possible design, when some or all of the functions are implemented by software, the polar code transmission apparatus includes a memory, configured to store a program, and a processor, configured to execute the program stored in the memory. When the program is executed, the polar code transmission apparatus can implement the method in the foregoing first aspect and any possible design of the first aspect.

Optionally, the memory may be a physically independent unit, or may be integrated with the processor.

In a possible design, when some or all of the functions are implemented by software, the polar code transmission apparatus includes a processor. A memory configured to store a program is located outside the polar code transmission apparatus. The processor is connected to the memory through a circuit/an electric wire, and is configured to read and execute the program stored in the memory.

According to a fourth aspect, a polar code transmission apparatus is provided. The apparatus has functions of implementing behavior of the transmit end in the foregoing second aspect and any possible design of the second aspect. The functions may be implemented by hardware, or may be implemented by hardware executing corresponding software. The hardware or the software includes one or more modules corresponding to the foregoing functions.

In a possible design, when some or all of the functions are implemented by hardware, the polar code transmission apparatus includes an input interface circuit, configured to obtain some or all of bit sequences U, a logic circuit, configured to perform behavior of the transmit end in the foregoing second aspect and any possible design of the second aspect, and an output interface circuit, configured to output an interleaved bit sequence.

Optionally, the polar code transmission apparatus may be a chip or an integrated circuit.

In a possible design, when some or all of the functions are implemented by software, the polar code transmission apparatus includes a memory, configured to store a program, and a processor, configured to execute the program stored in the memory. When the program is executed, the polar code transmission apparatus can implement the method in the foregoing first aspect and any possible design of the first aspect.

Optionally, the memory may be a physically independent unit, or may be integrated with the processor.

In a possible design, when some or all of the functions are implemented by software, the polar code transmission apparatus includes a processor. A memory configured to store a program is located outside the polar code transmission apparatus. The processor is connected to the memory through a circuit/an electric wire, and is configured to read and execute the program stored in the memory.

According to a fifth aspect, a wireless communications system is provided. The system includes the apparatus in the third aspect and the apparatus in the fourth aspect.

According to a sixth aspect, a computer readable storage medium is provided, configured to store a computer program. The computer program includes an instruction used to perform the method in any one of the first aspect or the possible implementations of the first aspect, or the method in any one of the second aspect or the possible implementations of the second aspect.

According to a seventh aspect, a computer program product including an instruction is provided. When the instruction runs on a computer, the computer is enabled to perform the methods of the foregoing aspects.

BRIEF DESCRIPTION OF THE DRAWINGS

FIG. 13a to FIG. 13c are schematic diagrams of a transformation matrix according to an embodiment of this application;

FIG. 14a to FIG. 14c are schematic diagrams of an information bit transformation matrix according to an embodiment of this application;

DETAILED DESCRIPTION OF ILLUSTRATIVE EMBODIMENTS

The following describes the embodiments of this application in detail with reference to accompanying drawings.

Figure 1:
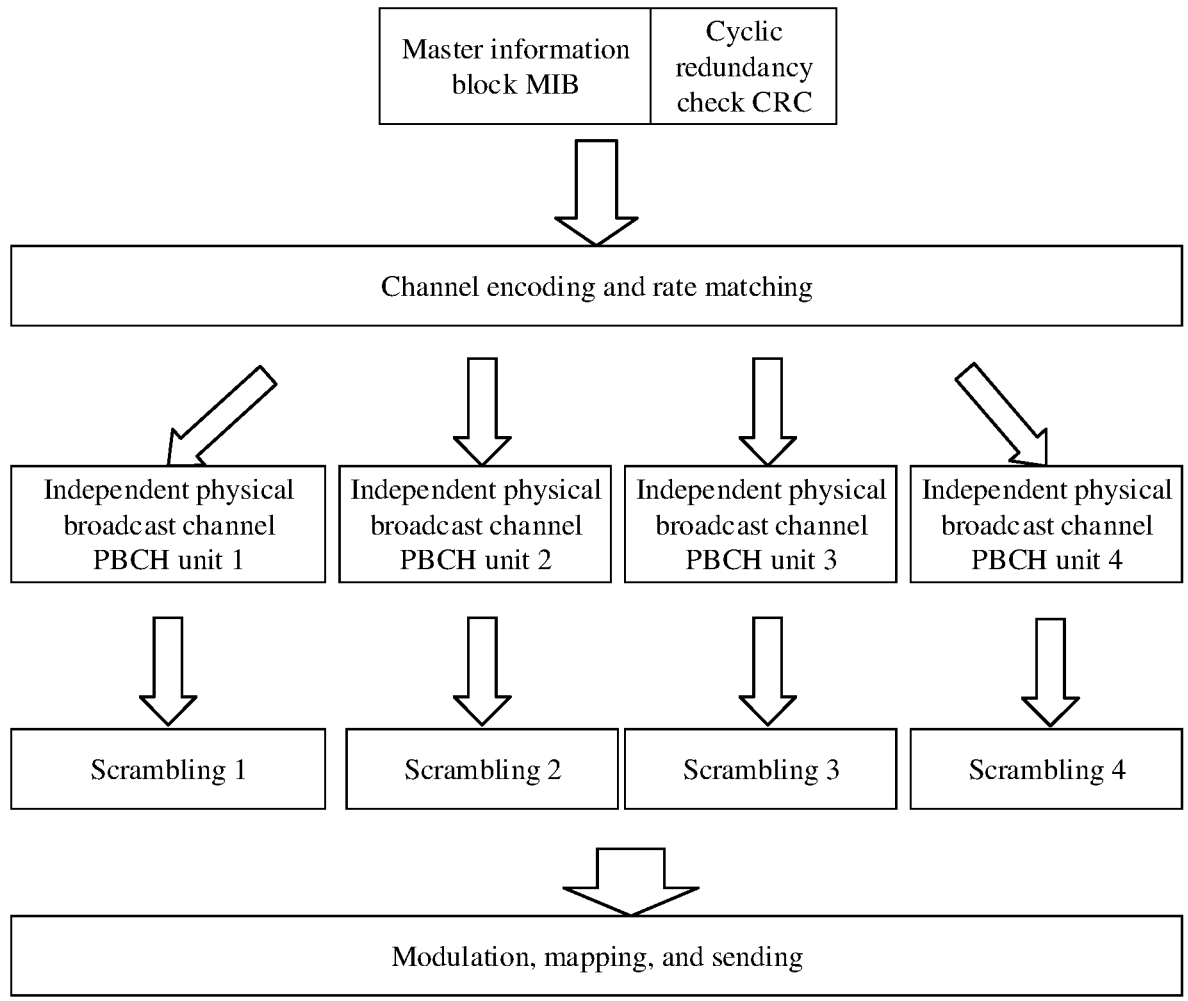
FIG. 1 is a schematic diagram of a PBCH processing process at a transmit end in the prior art.
Figure 2:
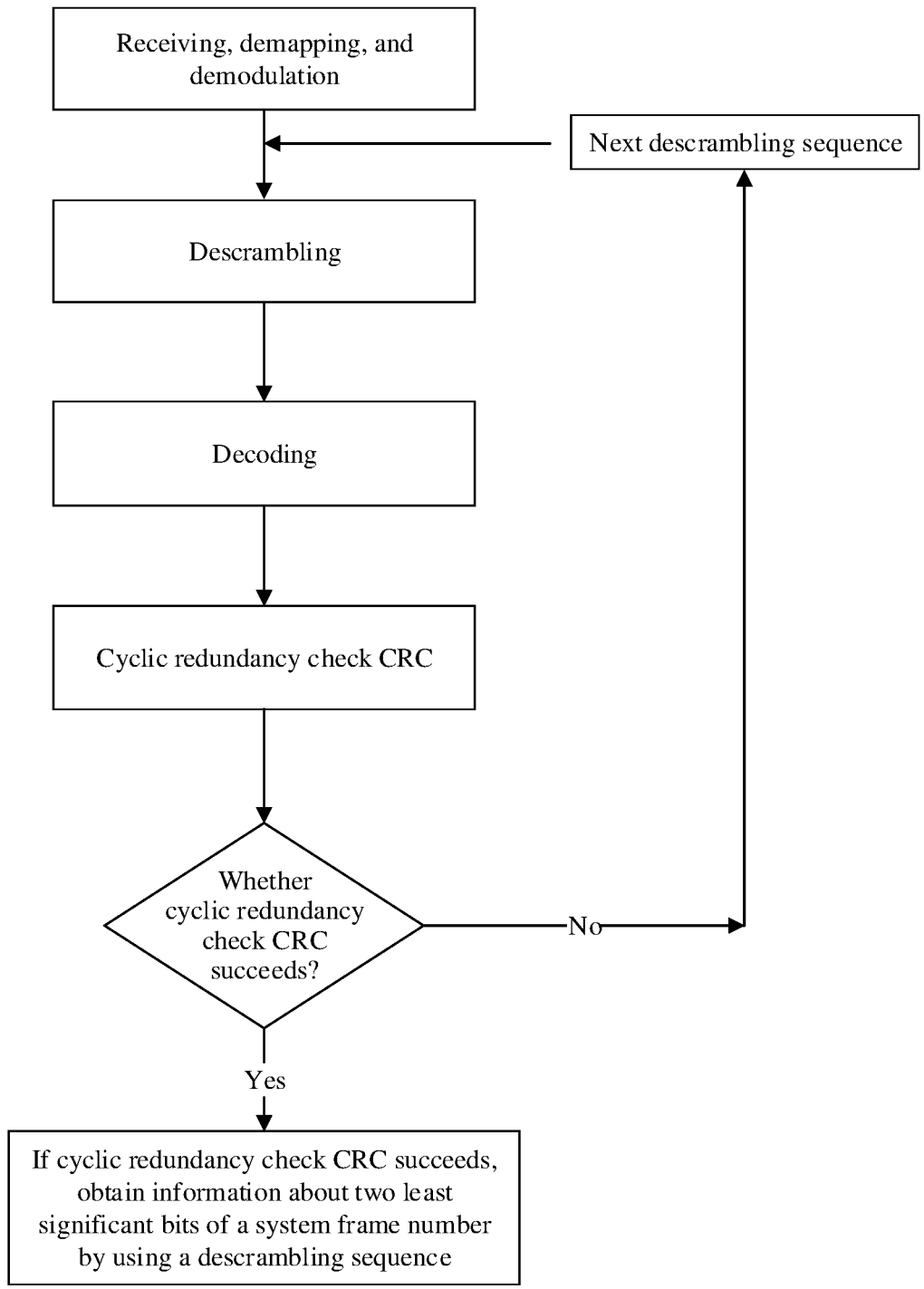
FIG. 2 is a schematic diagram of a PBCH processing process at a receive end in the prior art.
Figure 3:
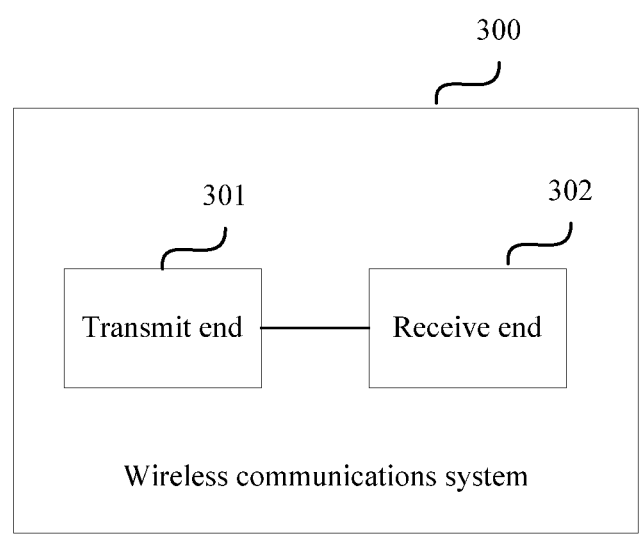
FIG. 3 is a schematic diagram of a wireless communications system according to an embodiment of this application.

As shown in FIG. 3, a wireless communications system 300 applied to the embodiments of this application includes a transmit end 301 and a receive end 302. The transmit end 301 may be a network device, and the receive end 302 is a terminal, or the transmit end 301 is a terminal, and the receive end 302 is a network device. The network device may be a base station, or may be a device that integrates a base station and a base station controller, or may be another device having a similar communication function.

It should be noted that the wireless communications system mentioned in the embodiments of this application includes but is not limited to a narrowband internet of things (NB-IoT) system, a global system for mobile communications (GSM), an enhanced data rates for GSM evolution (EDGE) system, a wideband code division multiple access (WCDMA) system, a code division multiple access 2000 (CDMA2000) system, a time division-synchronous code division multiple access (TD-SCDMA) system, a long term evolution (LTE) system, a next-generation 5G mobile communications system applied to three application scenarios: eMBB, URLLC, and mMTC, and a new communications system in the future.

The terminal in the embodiments of this application may include various handheld devices, vehicle-mounted devices, wearable devices, or computing devices having a wireless communication function, or another processing device connected to a wireless modem. The terminal may be an MS (Mobile Station), a subscriber unit a cellular phone, a smartphone, a wireless data card, a personal digital assistant (PDA) computer, a tablet computer, a wireless modem, a handheld device, a laptop computer, a machine type communication (MTC) terminal, or the like.

In the embodiments of this application, a polar code encoding mode is applied to a PBCH, and an encoded sequence obtained after polar code encoding is scrambled and interleaved, thereby avoiding timing confusion caused because polar codes sent at different timing are the same when a to-be-encoded bit sequence is an all-o vector, and helping the polar code encoding mode to be better applied to the PBCH.

For ease of understanding of the embodiments of this application, the following briefly describes a polar code.

A polar code encoding policy is that a noise-free channel is used for transmitting useful user information, and a pure noisy channel is used for transmitting agreed information or no information. The polar code is also a linear block code, and an encoding matrix of the polar code is $G_N$. An encoding process $x_1^N = u_1^N$, where $u_1^N = (u_1, u_2, \ldots, u_N)$ is a binary row vector of a length of N (namely, a code length), $G_N$ is an N×N matrix, and $G_N = F_2^{\otimes(log_2(N))}$, $F_2^{\otimes(log_2(N))}$ is defined as a Kronecker product of $log_2 N_{matrices}$ $F_2$. The foregoing matrix is $$F_2 = \begin{bmatrix} 1 & 0 \\ 1 & 1 \end{bmatrix}.$$

In a polar code encoding process, some bits $u_1^N$ are used to carry information and are referred to as a set of information bits, and a set of indexes of these bits is denoted as A, and other bits are set to fixed values pre-agreed on by a receive end and a transmit end, and are referred to as a set of fixed bits or a set of frozen bits, and a set of indexes of the bits is denoted as a complementary set $A^c$ of A. The polar code encoding process is equivalent to $x_1^N = u_A G_N \cdot (A) + u_{A^c} G_N \cdot (A^c)$. Herein, $G_N(A)$ is a submatrix including rows in $G_N$ that correspond to the indexes in the set A, $G_N(A^c)$ is a submatrix including rows in $G_N$ that correspond to the indexes in the set A, $u_A$ is the set of the information bits in $u_1^N$, a quantity of the information bits is K, $u_{A^c}$ is the set of the fixed bits in $u_1^N$, a quantity of the fixed bits is (N-K), and the fixed bits are known bits. These fixed bits are usually set to 0. However, a value of the fixed bit may be randomly set, provided that the receive end and the transmit end pre-agree on the value. Therefore, polar code encoding output may be simplified as follows: $x_1^N = u_A G_N(A)$. Herein, $u_A$ is the set of the information bits in $u_1^N$, $u_A$ is a row vector of a length of K, in other words, $|A|=K$, where $|\cdot|$ represents a quantity of elements in a set, and K is an information block size, $G_N(A)$ is a submatrix including rows in the matrix $G_N$ that correspond to the indexes in the set A, and $G_N(A)$ is a K×N matrix.

A polar code construction process is a process of selecting the set A, and determines polar code performance. The polar code construction process usually includes determining, based on a mother code length N, that there are a total of N polarized channels that respectively correspond to N rows of the encoding matrix, calculating reliability of the polarized channels, and using indexes of first K polarized channels with relatively high reliability as elements in the set A, and using indexes corresponding to rest (N—K) polarized channels as elements in the set $A^c$ including the indexes of the fixed bits. The set A determines locations of the information bits, and the set $A^c$ determines locations of the fixed bits.

The foregoing is a conventional polar code encoding mode. Based on the foregoing conventional polar code encoding mode, there may be two cases applicable to the embodiments of this application. In a first case, a length of a to-be-encoded bit sequence is N, and the length of the to-be-encoded bit sequence and a mother code length are the same and both are N. In the second case, a mother code length is d×N. In other words, to-be-encoded sequences form d parts of an equal length, U is any one of the d parts, and d is an exponential power of 2. In the second case, $G_N$ may be considered as a 1/d part of an encoding matrix corresponding to the to-be-encoded sequence of the length of N.

In the second case, a polar encoding matrix whose mother code length is d×N is as follows:

$$G_{N-1} = \begin{bmatrix} 1 & 0 \\ 1 & 1 \end{bmatrix}^{\otimes \log_2(d \times N)}.$$

A polar encoding matrix whose mother code length is N is as follows:

$$G_{N-2} = \begin{bmatrix} 1 & 0 \\ 1 & 1 \end{bmatrix}^{\otimes \log_2(N)}.$$

A relationship between the foregoing two polar encoding matrices is as follows:

$G_{N-1} = G_{N-2}^{\otimes \log_2(d)}$, where $\otimes$ is a Kronecker product.

A progressive interleaving based polar code may implement implicit transmission and carry implicit information. In the embodiments of this application, a scrambling manner is further used based on progressive interleaving, and it may be considered that a progressive interleaving and scrambling based polar code is used. This method of using the progressive interleaving and scrambling based polar code may be applied to but is not limited to the following scenarios: In scenario 1, during implicit PBCH timing transmission, both a plurality of times of soft combination of transmitted information and timing blind detection are supported. In scenario 2, during implicit information transmission in ultra-reliable and low latency communications (URLLC), both multiple-division concurrent transmission and blind detection of specific information are supported. In scenario 3, during single common transmission, blind detection of specific information is supported.

The following describes an implementation method for transmitting implicit information by using a progressive interleaving and scrambling based polar code.

1. A Scrambling Feature of the Polar Code

A polar encoding process may be represented as $u \cdot G_N = x$, where u is a 1×N to-be-encoded vector, x is a 1×N encoded vector, and $G_N$ is an N×N encoding matrix. Based on a matrix multiplication feature, $(u+p) \cdot G_N = x+q$, where $p \cdot G_N = q$, both p and q are 1×N vectors and may be respectively considered as scrambling vectors for u and x.

2. An Algebraic Feature of the Polar Code

Based on the scrambling feature of the polar code described above, an algebraic feature shown in FIG. 4 may be obtained.

Figure 4:
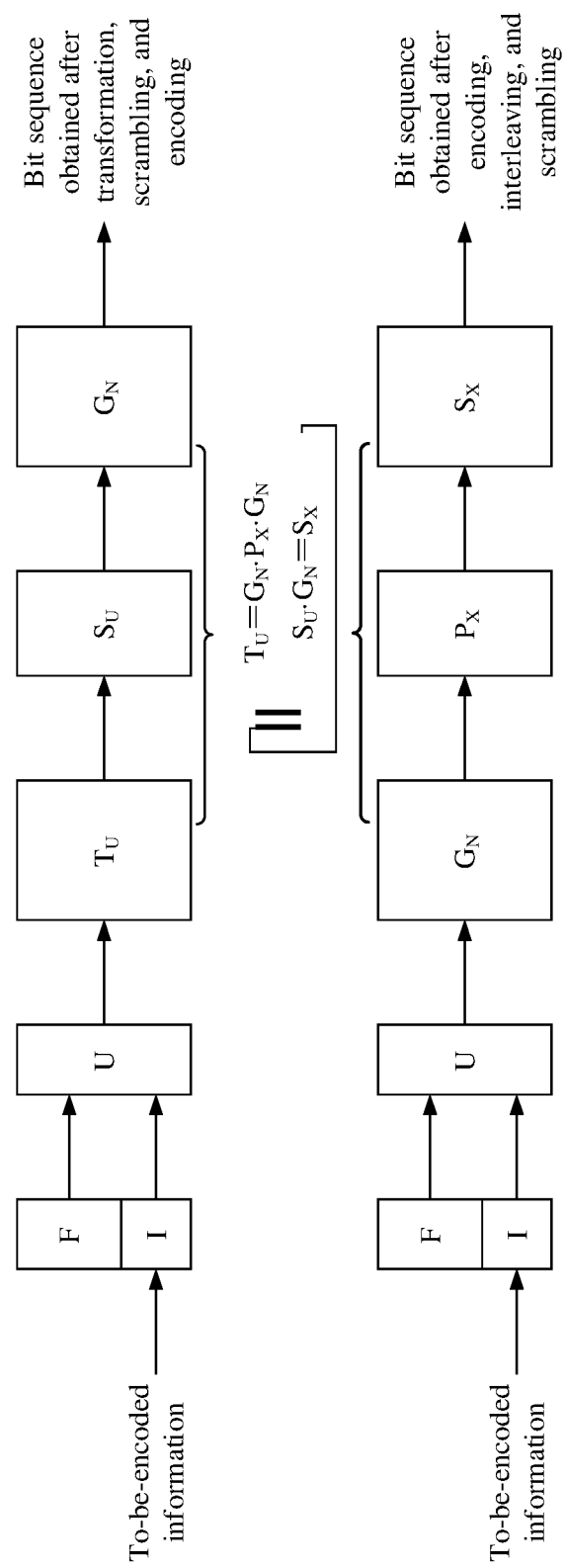
FIG. 4 is a schematic diagram of an algebraic feature of a polar code according to an embodiment of this application.

In FIG. 4, F is a set of fixed bits in a to-be-encoded vector U of the polar code, and includes (N—K) elements. I is to-be-encoded information in the to-be-encoded vector U of the polar code, and includes K elements, and the K elements include an information bit and a check bit. An example in which a check manner is CRC is used, and therefore the check bit is a CRC bit. U is a to-be-encoded information vector or a to-be-encoded bit sequence of the polar code, and is a 1×N vector. $P_X$ is an N×N matrix, and represents an operation of multiplying an input bit vector by $P_X$. Optionally, $P_X$ is a permutation matrix, in other words, a row-column transformation matrix in which each row includes only one element 1 and each column includes only one element 1. Multiplying the input bit vector by Px is equivalent to performing an interleaving operation on the input bit vector because Px is the row-column transformation matrix. More generally, Px may be referred to as an interleaving matrix. Tu is an N×N matrix, and represents an operation of multiplying an input bit vector by Tu. $S_X$ and $S_U$ each are a 1×N vector and represent a scrambling operation on an input bit vector.

If $T_u = G_N P_X G_N$, and $S_X = S_U \cdot G_N$, results of implementing operation procedures of an upper half part and a lower half part in FIG. 4 are equivalent, and output bit sequences are the same. In the embodiments of this application, $T_u$ may be referred to as a transformation matrix, Px may be referred to as an interleaving matrix, and $S_X$ and $S_U$ each are referred to as a scrambling vector.

Encoding methods used before and after an operation order of Tu and Su in FIG. 4 is reversed are still equivalent. Likewise, two encoding methods used before and after an operation order of Px and Sx in FIG. 4 is reversed are still equivalent.

Specifically, in the upper half part in FIG. 4, a set F of fixed bits and a set I of information bits constitute the to-be-encoded information vector U, U is multiplied by the transformation matrix $T_u$, by using $S_U$, a scrambling operation is performed on a vector that is output after U is multiplied by the transformation matrix $T_u$, a scrambled vector is encoded by using the encoding matrix $G_N$, to output an encoded bit sequence. In the lower half part in FIG. 4, a set F of fixed bits and a set I of information bits constitute the to-be-encoded information vector U, U is encoded by using the encoding matrix $G_N$, an encoded vector is multiplied by the interleaving matrix $P_X$, by using $S_X$, a scrambling operation is performed on a vector obtained by multiplying the encoded vector by $P_X$, and a scrambled bit sequence is output.

3. A progressive interleaving and scrambling based polar code transmission method Based on the algebraic feature of the polar code described above, a progressive interleaving and scrambling manner may be designed to transmit implicit information by using a quantity m of times of interleaving and scrambling.

Figure 5:
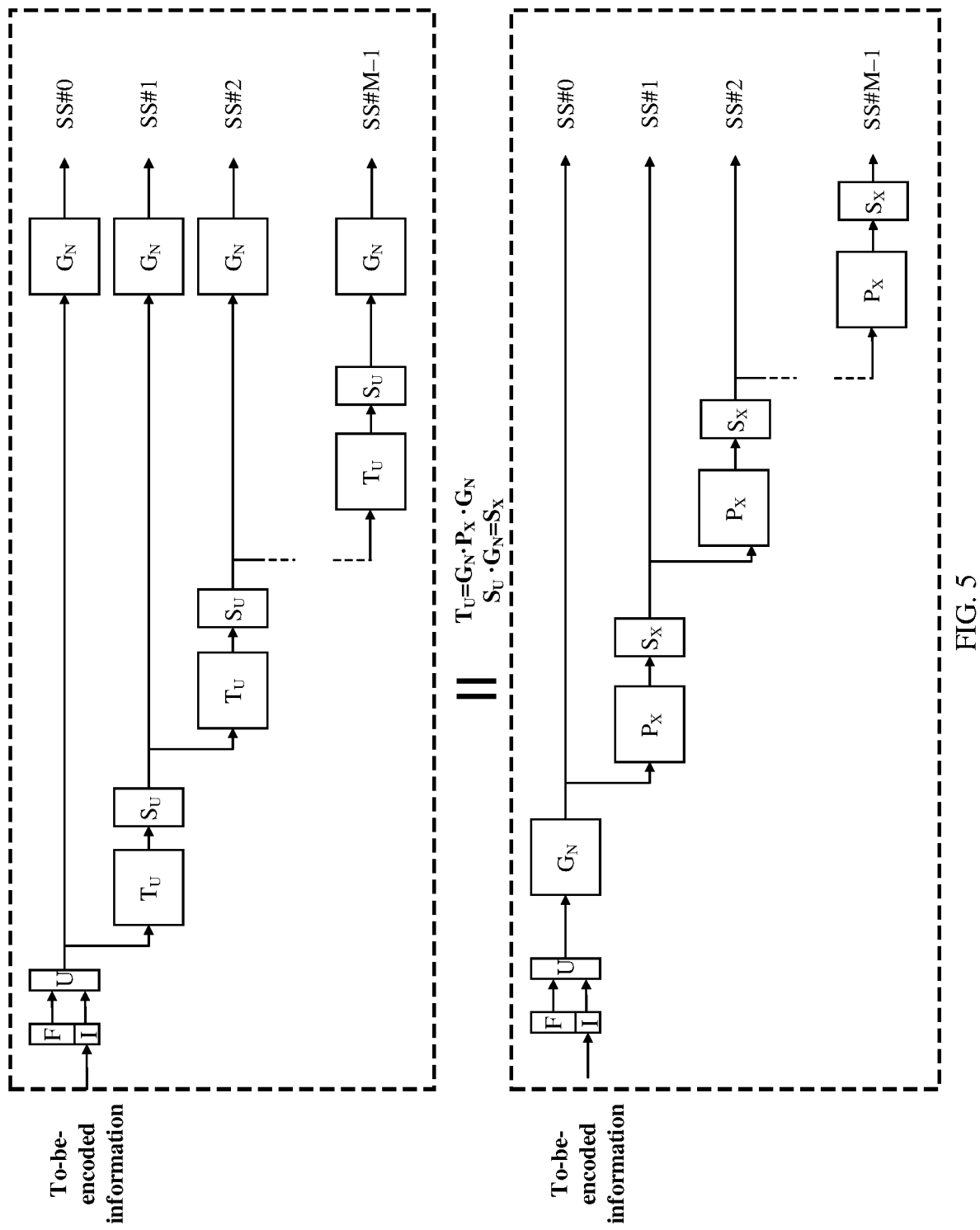
FIG. 5 is a schematic diagram 1 of a progressive interleaving and scrambling manner for a polar code according to an embodiment of this application.

As shown in FIG. 5, an output version, in other words, an output bit sequence, may vary with the quantity m of times of interleaving and scrambling. Different versions carry implicit information m, and m may be used to describe various information such as an antenna port, a carrier location, and timing. A value of m ranges from 0 to M−1, and a value of M may be agreed on by the transmit end and the receive end. In FIG. 5, when a value of the quantity m of times of interleaving and scrambling ranges from 0 to M−1, output versions are respectively represented as SS #0 to SS #M−1. It can be understood that progressive interleaving and scrambling is an interleaving and scrambling operation performed at each layer based on interleaving and scrambling at a last layer. Likewise, results of implementing operation procedures of an upper half part and a lower half part in FIG. 5 are equivalent, and output bit sequences are the same.

Figure 6:
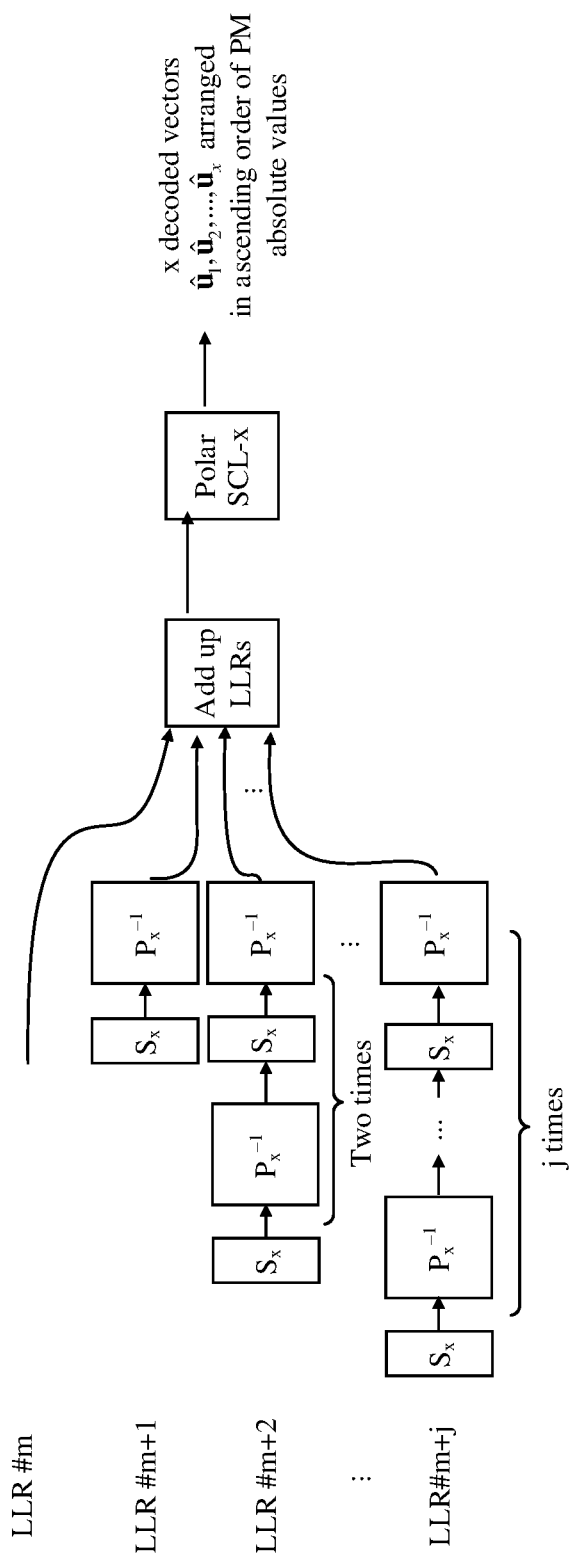
FIG. 6 is a schematic diagram 1 of a manner of performing decoding and de-interleaving by a receive end according to an embodiment of this application.

Different versions sent by the transmit end carry different implicit information m. After receiving a decoded sequence, the receive end performs blind detection by using a reverse procedure of the procedure shown in FIG. 5, and may obtain implicit information based on m, for example, may obtain timing information, in other words, transmit timing corresponding to a version. In addition, the receive end may alternatively implement soft combination of different received versions, and then perform decoding, thereby facilitating successful decoding when a channel condition is poor. Specifically, as shown in FIG. 6, to-be-decoded versions received by the receive end are represented as LLR #m, LLR #m+1, LLR #m+2, . . . , and LLR #m+j. The receive end performs a reverse operation of the procedure shown in FIG. 5 by using a procedure shown in FIG. 6, where $S_X$ represents scrambling a log-likelihood ratio (LLR) vector. The LLR is obtained through symbol demodulation and is used to indicate a probability that the bit is 0 or 1. Scrambling and descrambling operations are the same in a binary case. $Px^{-1}$ represents a de-interleaving operation performed on an input LLR vector. Different LLRs obtained through the de-interleaving operation are added up, and polar decoding is performed on a signal obtained after adding, to obtain a decoded vector. For example, in an optional implementation, a conventional successive cancellation list (SCL)-x polar decoding manner is used as a polar decoding manner, to obtain x decoded vectors, and the x decoded vectors may be sorted in ascending order of PM absolute values to obtain $\hat{u}_1, \hat{u}_2, \ldots, \hat{u}_x$. Certainly, another polar decoding manner may be used, and this is not limited in this application.

Figure 7:
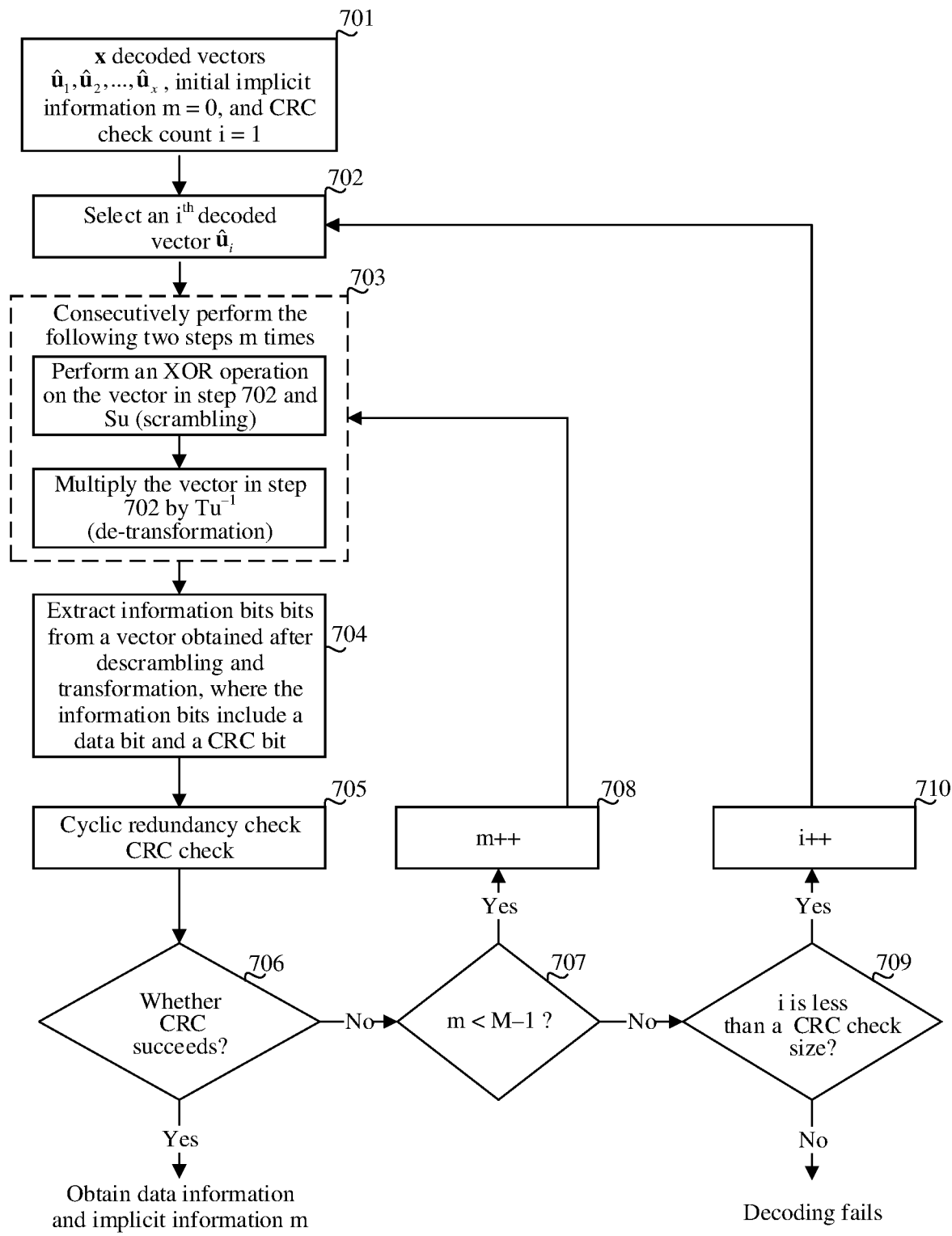
FIG. 7 is a schematic diagram 1 of a procedure of blind detection by a receive end according to an embodiment of this application.

As shown in FIG. 7, after obtaining the x decoded vectors, the receive end performs blind detection to obtain data information and implicit information m. A reverse procedure of the upper half part procedure shown in FIG. 5 may be performed, and specific steps are described as follows.

Step 701: The receive end receives the x decoded vectors, where initial implicit information m is 0, and an initial value of a CRC check count is i=1.

Step 702: The receive end selects an $i^{th}$ decoded vector $\hat{u}_i$.

Step 703: Scramble the decoded vector $\hat{u}_i$ by using $S_U$, and multiply a scrambled vector by $Tu^{-1}$ to perform de-transformation.

Step 703 is repeatedly performed m times in total.

Step 704: Extract data information obtained after de-transformation in step 703, where the data information includes an information bit and a CRC bit.

Step 705: The receive end performs CRC check on the data information.

Step 706: The receive end determines whether CRC check succeeds, and if CRC check succeeds, obtain the information bit and implicit information m that is used in this round of check, or if CRC check fails, perform step 707.

Step 707: The receive end determines whether m is less than M−1, and if m is less than M−1, perform step 708, or if m is not less than M−1, perform step 709.

Step 708: Perform an m++ operation, in other words, update m based on m=m+1, and return to perform step 703.

Step 709: The receive end determines whether i is less than a CRC check size, and if i is less than the CRC check size, perform step 710, or if i is not less than the CRC check size, determine that decoding fails, where the CRC check size is predefined.

Step 710: Perform an i++ operation, in other words, update i based on i=i+1, and return to perform step 702.

Figure 8:
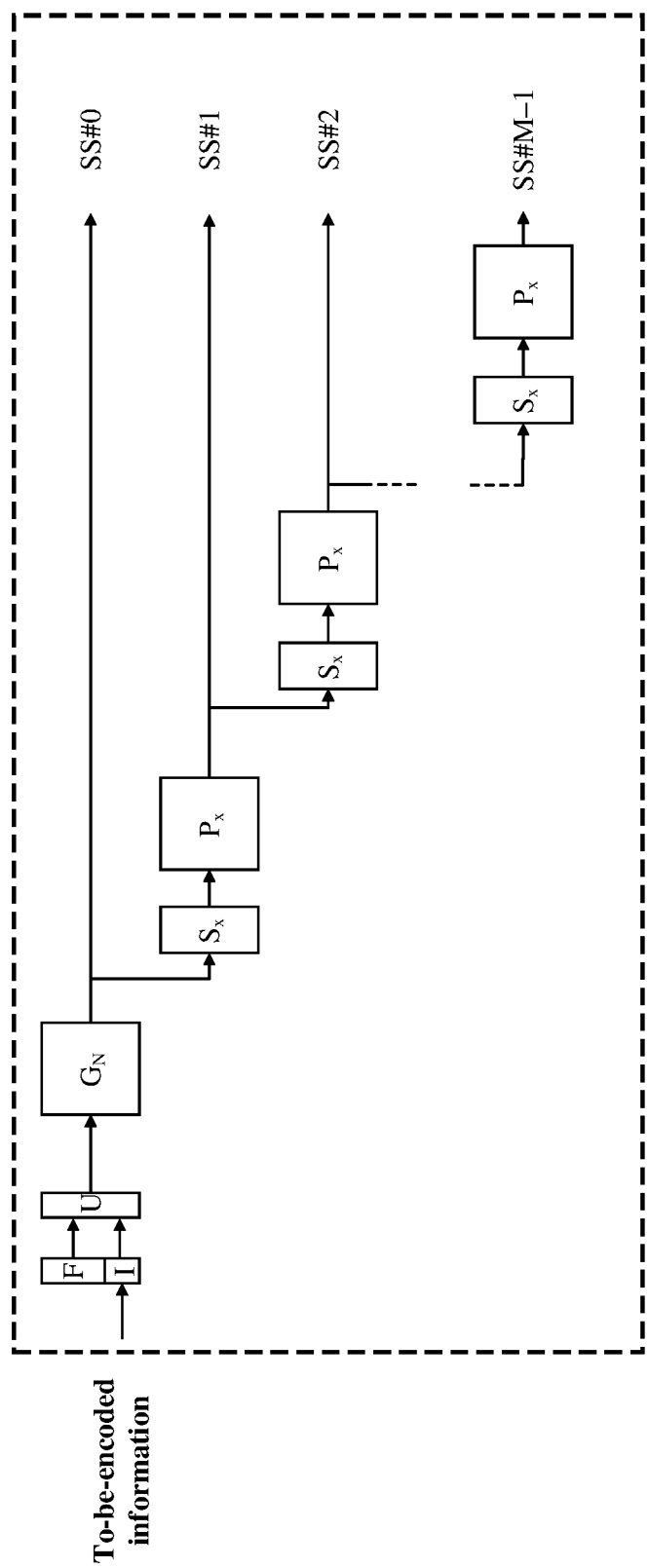
FIG. 8 is a schematic diagram of a progressive scrambling and interleaving manner for a polar code according to an embodiment of this application.

As described above, a same effect can be achieved when an order between scrambling and interleaving in FIG. 5 is reversed, and the operations performed in the two orders may be exactly equivalent mathematically. The process in the lower half part in FIG. 5 is used as an example. A procedure shown in FIG. 8 is obtained by reversing an order between scrambling and interleaving. Assuming that $S_X$ used in FIG. 5 is denoted as $S_{X-1}$ and $S_X$ used in FIG. 8 is denoted as $S_{X-2}$, $S_{X-1}$ and $S_{X-2}$ meet the following relationships.

When a length of U is the same as a mother code length, $S_{u-1}=S_{u-2} \cdot T_u \Rightarrow S_{u-2}=S_{u-1} \cdot T_u^{-1}$, $S_{X-1}=S_{U-1} \cdot G_N$, and $S_{X-2}=S_{U-2} \cdot G_N$.

When a length of U is N, and a mother code length is N×d, for a relationship between $S_{X-1}$ and $S_{U-1}$ and a relationship between $S_{X-2}$ and $S_{U-2}$, refer to a scrambling vector transformation rule of a segmented polar code.

In this embodiment of this application, the scrambling vector transformation rule of the segmented polar code may be defined as follows. For a polar code of a length of N×d, scrambling vectors $S_{u1}, S_{u2}, \ldots, S_{ud}$ for all segments of u are first determined, then the scrambling vectors are combined into a vector $[S_{u1}, S_{u2}, \ldots, S_{ud}]$ of a length of N×d, and $[S_{u1}, S_{u2}, \ldots, S_{ud}]$ is multiplied by a polar code encoding matrix of a length of N×d to obtain $[S_{x1}, S_{x2}, \ldots, S_{xd}]$, where $S_{x1}, S_{x2}, \ldots, S_{xd}$ are scrambling vectors respectively corresponding to $S_{u1}, S_{u2}, \ldots, S_{ud}$. A formula is as follows: $[S_{u1}, S_{u2}, \ldots, S_{ud}] \cdot G_{N \times d} = [S_{x1}, S_{x2}, \ldots, S_{xd}]$.

For ease of comparison, both scrambling vectors in FIG. 5 and FIG. 8 are represented as $S_X$.

An output version, in other words, an output bit sequence, may vary with the quantity m of times of scrambling and interleaving. A value of m ranges from 0 to M−1, and a value of M may be agreed on by the transmit end and the receive end. When a value of the quantity m of times of scrambling and interleaving ranges from 0 to M−1, output versions are respectively represented as SS #0 to SS #M−1. It can be understood that progressive scrambling and interleaving is an interleaving and scrambling operation performed at each layer based on interleaving and scrambling at a last layer.

Figure 9:
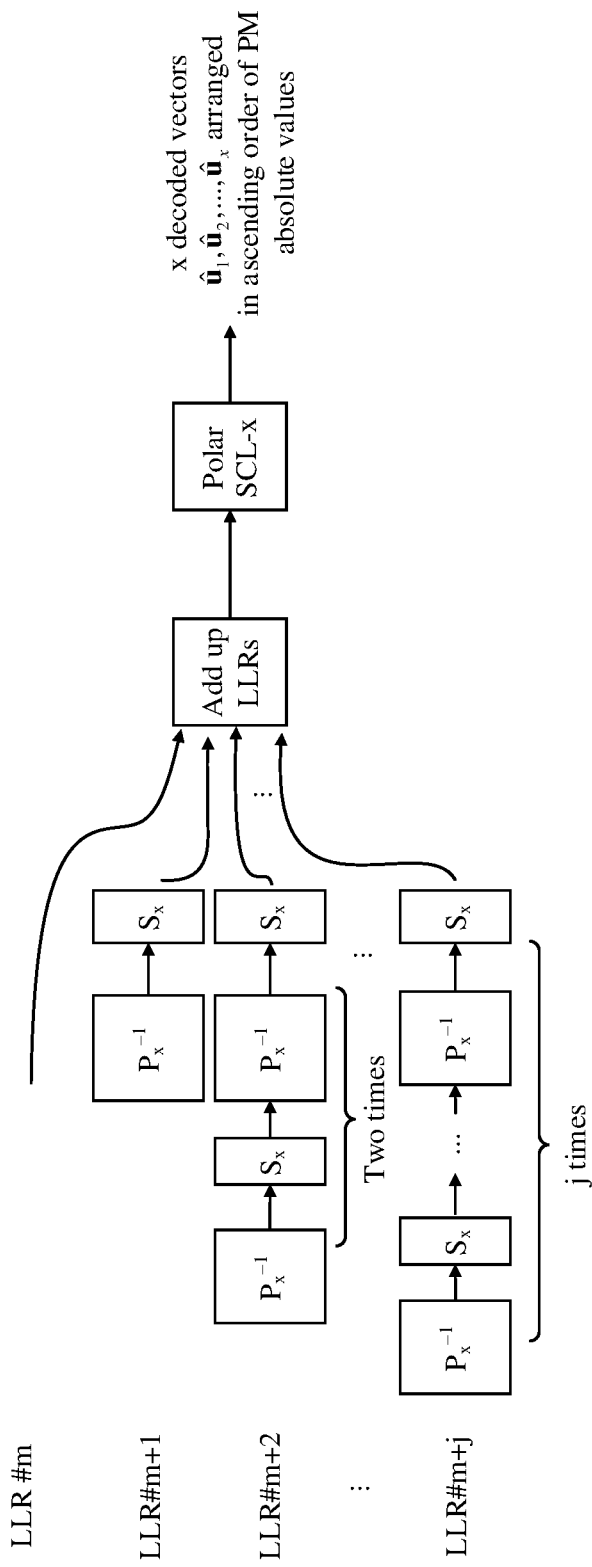
FIG. 9 is a schematic diagram 2 of a manner of performing decoding and de-interleaving by a receive end according to an embodiment of this application.

Likewise, after receiving a decoded sequence, the receive end performs blind detection by using a reverse procedure of the procedure shown in FIG. 8, and may obtain implicit information based on m. Specifically, as shown in FIG. 9, to-be-decoded versions received by the receive end are represented as LLR #m, LLR #m+1, LLR #m+2, . . . , and LLR #m+j. $Px^{-1}$ represents a de-interleaving operation performed on an input LLR vector, and Sx represents scrambling performed on a vector obtained after a de-interleaving operation. Scrambling and de-scrambling operations are the same. Different LLRs obtained after Sx scrambling are added up, and conventional SCL-x polar decoding is performed on a signal obtained after adding, to obtain x decoded vectors, and the x decoded vectors may be sorted in ascending order of PM absolute values to obtain $\hat{u}_1$, $\hat{u}_2, \ldots, \hat{u}_x$.

Figure 10:
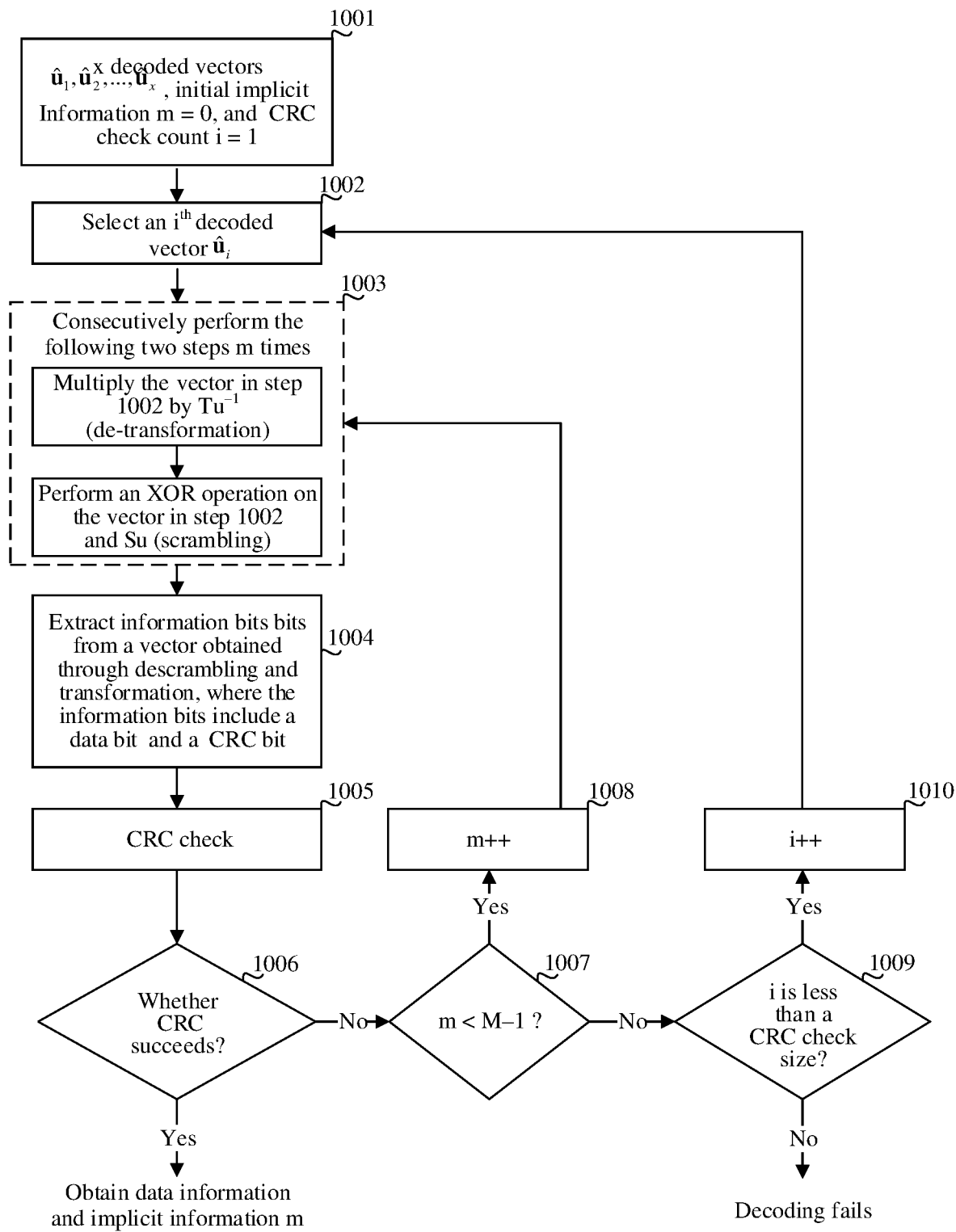
FIG. 10 is a schematic diagram 2 of a procedure of blind detection by a receive end according to an embodiment of this application.

As shown in FIG. 10, after obtaining the x decoded vectors, the receive end performs blind detection to obtain data information and implicit information m. A reverse procedure in the upper half part of the procedure shown in FIG. 5 may include the following specific steps.

Step 1001: The receive end receives the x decoded vectors, where initial implicit information m is 0, and an initial value of a CRC check count is i=1.

Step 1002: The receive end selects an $i^{th}$ decoded vector $\hat{u}_i$.

Step 1003: Multiply the decoded vector $\hat{u}_i$ by $Tu^{-1}$ to perform de-transformation, and scramble a de-transformed vector by using $S_U$.

Step 1003 is repeatedly performed m times in total.

Step 1004: Extract data information obtained after de-transformation in step 1003, where the data information includes an information bit and a CRC bit.

Step 1005: The receive end performs CRC check on the data information.

Step 1006: The receive end determines whether CRC check succeeds, and if yes, obtain the information bit and implicit information m that is used in this round of check, otherwise, perform step 1007.

Step 1007: The receive end determines whether m is less than M−1, and if m is less than M−1, perform step 1008, or if m is not less than M−1 otherwise, perform step 1009.

Step 1008: The receive end performs an m++ operation, in other words, update m based on m=m+1, and return to perform step 1003.

Step 1009: The receive end determines whether i is less than a CRC check size, and if yes, perform step 1010, otherwise, determine that decoding fails, where the CRC check size is predefined.

Step 1010: The receive end performs an i++ operation, in other words, update i based on i=i+1, and return to perform step 1002.

It can be learned from the foregoing descriptions that, after transformation and scrambling are performed m times on data sent by the transmit end each time, the implicit information m is carried in obtained data, and data sent at different times may be sent at different time and different frequencies.

Figure 11:
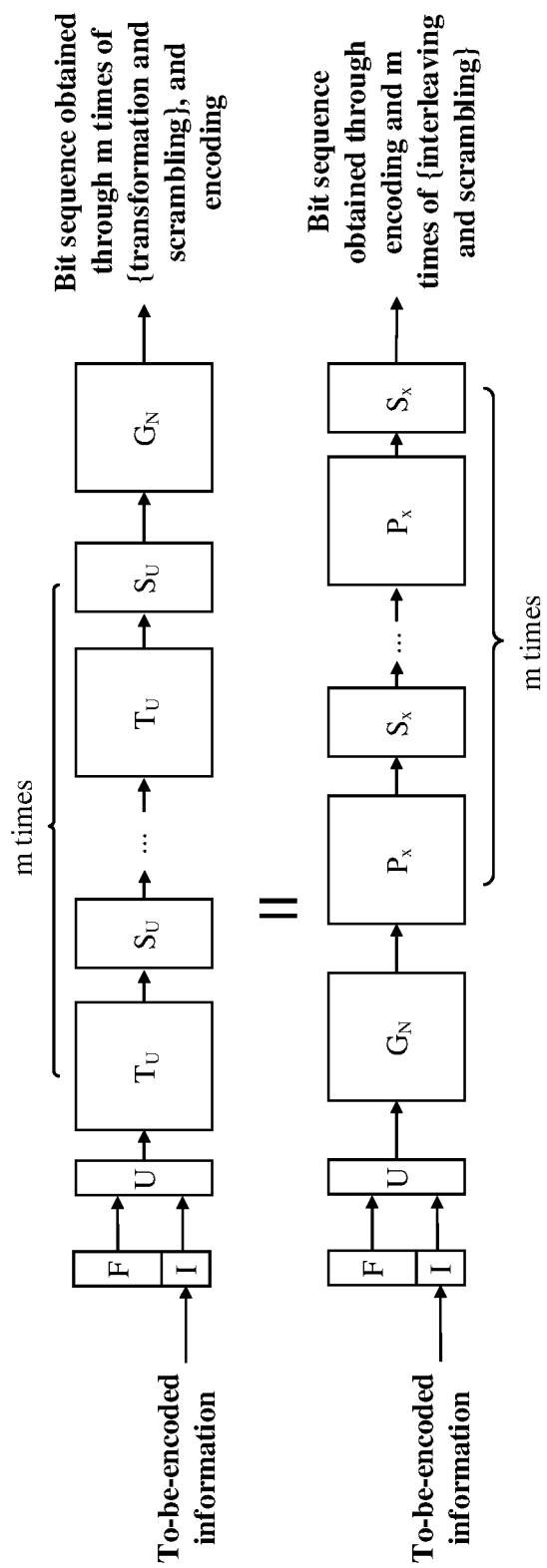
FIG. 11 is a schematic diagram 2 of a progressive interleaving and scrambling manner for a polar code according to an embodiment of this application.

As shown in FIG. 11, during m times of interleaving and scrambling of data sent at a single time, transformation and scrambling may be performed by using a transformation matrix Tu and a scrambling vector Su before encoding is performed by using an encoding matrix $G_N$, or interleaving and scrambling may be performed by using an interleaving matrix Px and a scrambling vector Sx after encoding is performed by using the encoding matrix $G_N$. Certainly, an operation order of the two steps of interleaving and scrambling may be reversed, and achieved effects are equivalent.

Figure 12:
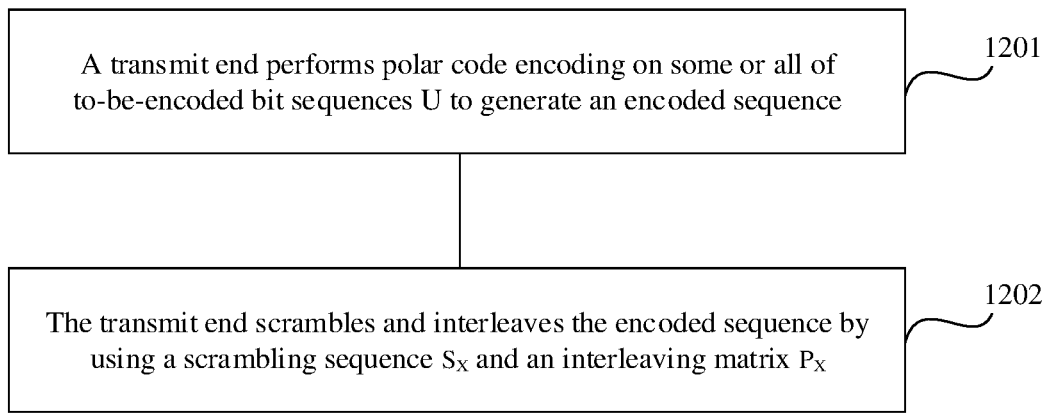
FIG. 12 is a schematic flowchart of a polar code transmission method according to an embodiment of this application.

Based on the foregoing descriptions, the following describes in detail a polar code transmission method provided in the embodiments of this application. As shown in FIG. 12, in an embodiment of this application, a specific procedure of the polar code transmission method is as follows.

Step 1201: A transmit end performs polar code encoding on some or all of to-be-encoded bit sequences U to generate an encoded sequence.

A length of U is N.

Step 1202: The transmit end scrambles and interleaves the encoded sequence by using a scrambling sequence Sx and an interleaving matrix Px.

Specifically, the bit sequence U in step 1201 is applicable to two cases. In a first case, a mother code length is N, and the length of U is the same as the mother code length. In a second case, a mother code length is d×N, in other words, the to-be-encoded sequences form d parts of an equal length, U is any one of the d parts, and d is an exponential power of 2. In the second case, $G_N$ may be considered as a 1/d part of an encoding matrix corresponding to the to-be-encoded sequence of the length of N.

Figures 13A, 13B:
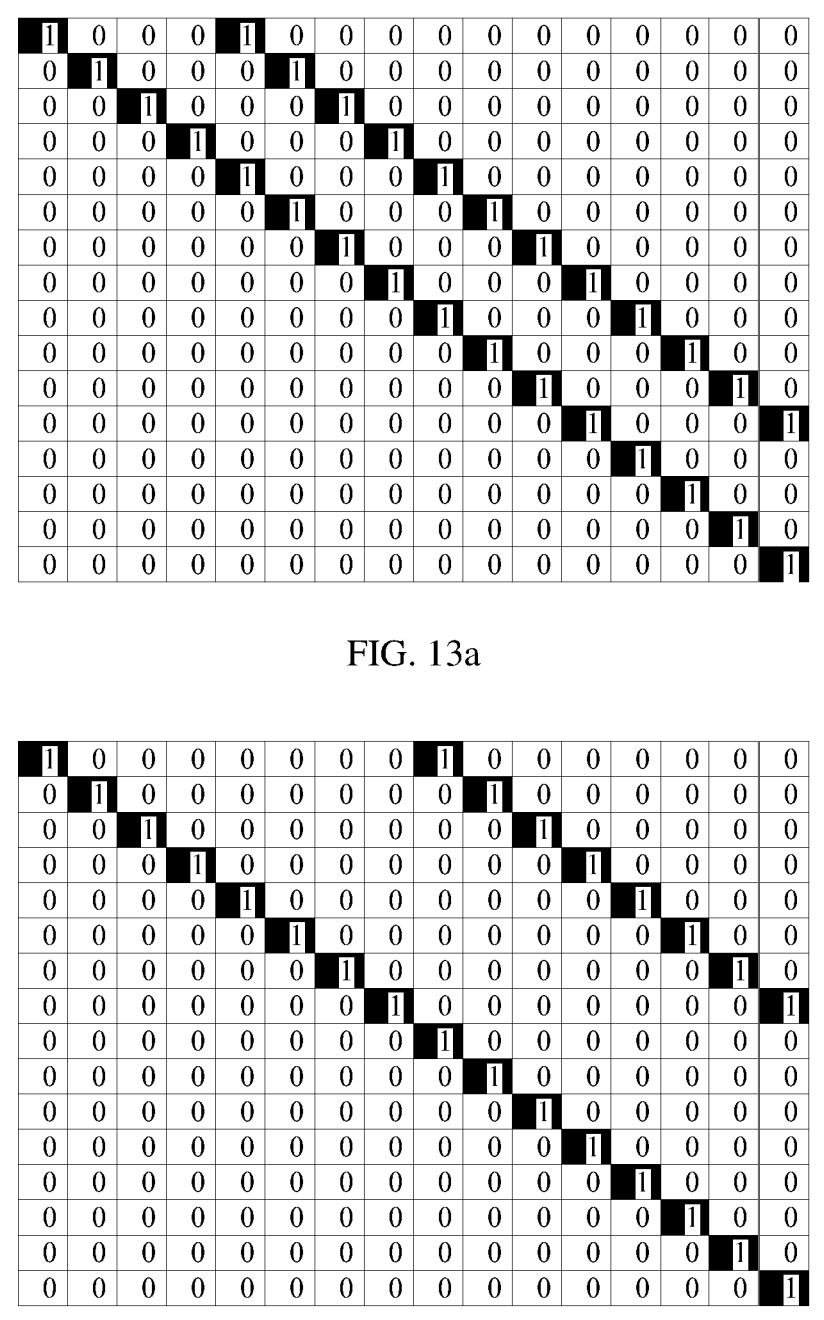
Figures 13C, 14A:
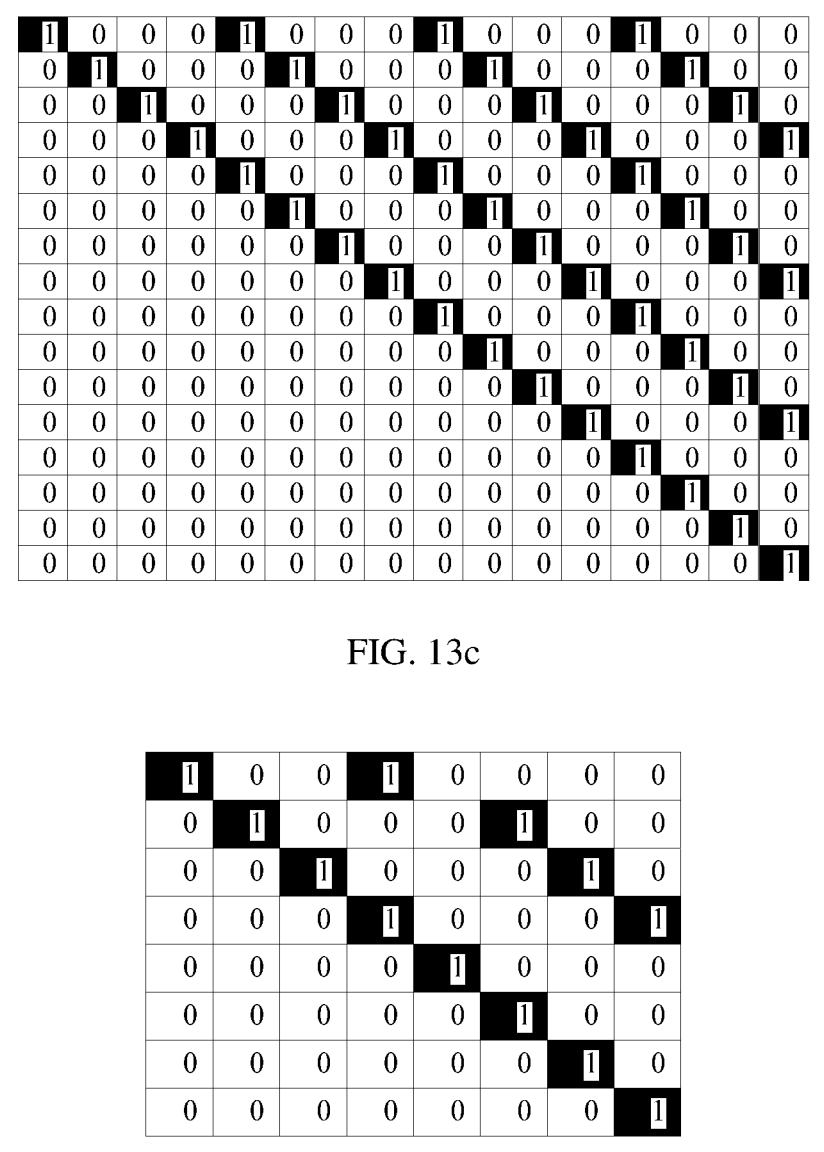

For convenience of description, how to extract an information bit transformation matrix from $T_u^m$ is first described. The information bit transformation matrix is a matrix including column vectors that are in $T_u^m$ and that correspond to information bit locations in U, where 1≤m≤M−1. Based on different values of m, quantities of times of transformation and scrambling performed on U are different, transmission versions corresponding different quantities of times correspond to different $T_u^m$. For example, N=16, and an information bit length K is 8. Px is a cyclic shift matrix with an offset of N/4, a total of four transmission versions are supported, and corresponding transformation matrices are I, $T_u^1$, $T_u^2$, and $T_u^3$, where $T_u^1$, $T_u^2$, and $T_u^3$ are respectively shown in FIG. 13a to FIG. 13c. The information bit locations in U are {8 10 11 12 13 14 15 16}. Rows and columns whose location indexes are {8 10 11 12 13 14 15 16} are extracted from each of $T_u^1$, $T_u^2$, and $T_u^3$, and generated $T_{uA}$, $T_{uA}^2$, and $T_{uA}^3$ are information bit transformation matrices that are respectively shown in FIG. 14a, FIG. 14b, and FIG. 14c, where $T_{uA}$, $T_{uA}^2$, and $T_{uA}^3$ are 8×8 matrices, and $T_{uA}$, $T_{uA}^2$, and $T_{uA}^3$ are respectively submatrices of $T_u^1$, $T_u^2$, and $T_u^3$.

The following describes how to determine the scrambling sequence $S_X$ in the first case and the second case. Because $S_X = S_U \cdot G_N$, $S_X$ may be alternatively determined by determining $S_U$.

In the first case, $S_X$ may be determined in, but is not limited to, the following several manners.

(1) If a bit at an $(N/2)^{th}$ location in U is an information bit, and a bit at an $(N/4)^{th}$ location in U is a fixed bit, bits at a first location to an $(N/2)^{th}$ location in Sx are set to 1, where if a sequence number in Sx starts from 0, bits at a $0^{th}$ location to an $((N/2)−1)^{th}$ location in Sx are set to 1, or if a bit at an $(N/2)^{th}$ location in U is an information bit, and a bit at an $(N/4)^{th}$ location in U is a fixed bit, a bit at an $(N/2)^{th}$ location in Su is set to 1.

(2) If a bit at an $(N/4)^{th}$ location in U is a fixed bit, a bit that is in Su and that corresponds to a first information bit location in U is set to 1.

(3) Column vectors that are in $T_u$ and that correspond to information bit locations in U constitute an information bit transformation matrix, and a bit that is in Su and that corresponds to a location of a row in Tu is set to 1, where the row has a largest row weight in an M×M upper triangular matrix in the information bit transformation matrix, and M is a positive integer greater than or equal to 2.

Optionally, if there are at least two M×M upper triangular matrices in the information bit transformation matrix, a bit that is in Su and that corresponds to a location of a row in Tu is set to 1, where the row has a largest row weight in at least one M×M upper triangular matrix.

Figures 15, 16:
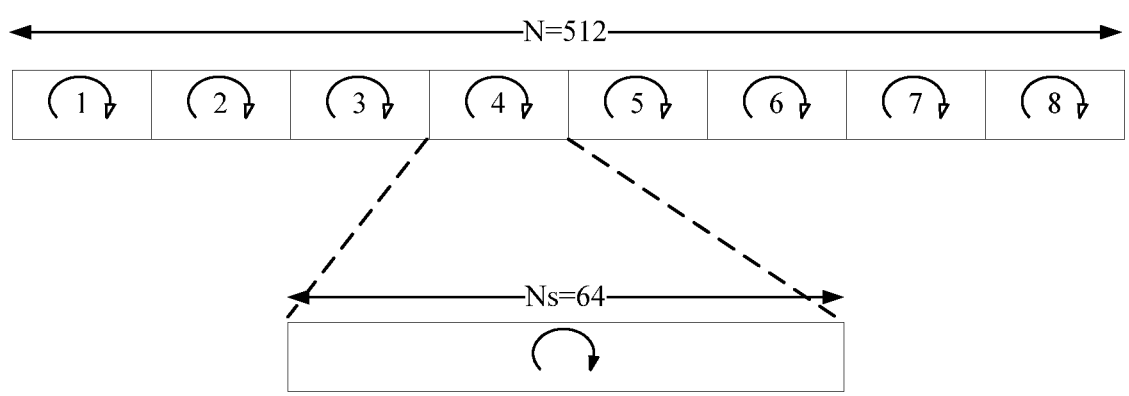
FIG. 15 is a schematic diagram of an upper triangular matrix in an information bit transformation matrix according to an embodiment of this application.
FIG. 16 is a schematic diagram of segmented cyclic shifts by a transmit end according to an embodiment of this application.

For example, more than one 2×2 upper triangular matrix may be found in an information bit transformation matrix $T_{u_A}{}^m$, where $1 \leq m \leq M-1$. In FIG. 15, one of parts indicated by two dashed rectangular boxes is the 2×2 upper triangular matrix. For example, only one 2×2 upper triangular matrix can be found in $T_{u_A}{}^2$, a plurality of 2×2 upper triangular matrices can be found in $T_{u_A}{}^3$, and one 3×3 upper triangular matrix exists in $T_{u_A}{}^3$.

In the second case, $S_u$ may be determined in, but is not limited to, the following several manners.

1. If a bit at an $(N/2)^{th}$ location in U is an information bit, and a bit at an $(N/4)^{th}$ location in U is a fixed bit, a bit at an $(N/2)^{th}$ location in Su is set to 1.

2. If a bit at an $(N/4)^{th}$ location in U is a fixed bit, a bit that is in Su and that corresponds to a first information bit location in U is set to 1.

3. Column vectors that are in $T_u$ and that correspond to information bit locations in U constitute an information bit transformation matrix, and a bit that is in Su and that corresponds to a location of a row in Tu is set to 1, where the row has a largest row weight in an M×M upper triangular matrix in the information bit transformation matrix, and M is a positive integer greater than or equal to 2. Optionally, if there are at least two M×M upper triangular matrices in the information bit transformation matrix, a bit that is in Su and that corresponds to a location of a row in Tu is set to 1, where the row has a largest row weight in at least one M×M upper triangular matrix.

After $S_u$ is determined, $S_x$ is calculated according to a scrambling vector transformation rule of a segmented polar code.

According to the foregoing method shown in FIG. 12, timing confusion caused because polar codes sent at different timing are the same when the to-be-encoded bit sequence U is an all-o vector is avoided, helping a polar encoding mode to be better applied to a PBCH.

In another possible implementation, the scrambling sequence $S_X$ may be an all-0 vector. More generally, the transmit end may alternatively not perform a scrambling step. To be specific, in step 1202, the transmit end only interleaves the encoded sequence by using the interleaving matrix $P_X$ without performing the scrambling step. In this case, a timing confusion problem caused because U is an all-0 vector can be resolved by setting a fixed bit at a specific location in U to 1.

Specifically, the following several setting rules may be included.

A first rule: If a bit at an $(N/2)^{th}$ location in U is a fixed bit, the fixed bit at the $(N/2)^{th}$ location in U is set to 1.

A second rule: If a bit at an $(N/2)^{th}$ location in U is an information bit, and a bit at an $(N/4)^{th}$ location in U is a fixed bit, the bit at the $(N/4)^{th}$ location in U is set to 1.

A third rule: If a sequence number of a first information bit in U is greater than N/4, a fixed bit at an $(N/4)^{th}$ location sorted before the first information bit in U in a natural polar code order is set to 1.

A fourth rule: Column vectors that are in $T_u$ and that correspond to information bit locations in U constitute an information bit transformation matrix, a row of a largest row weight in an M×M upper triangular matrix in the information bit transformation matrix corresponds to a location index in U, and if an $(N/4)^{th}$ bit sorted before the location index in U in a polar code natural order is a fixed bit, the $(N/4)^{th}$ fixed bit sorted before the location index in U in the natural polar code order is set to 1, where M is a positive integer greater than or equal to 2.

Optionally, if there are at least two M×M upper triangular matrices in the information bit transformation matrix, at least one M×M upper triangular matrix is selected to perform the foregoing processing.

The following describes in detail, based on specific application scenarios, a manner for determining a scrambling vector $S_X$ or a manner for determining a location of a fixed bit that is in U and that is set to 1.

An original solution is as follows.

It is assumed that the interleaving matrix Px is a cyclic shift matrix. When no scrambling operation is performed in step 1202, and the foregoing solution in which a fixed bit at a specific location in U is set to 1 and that is provided in this embodiment of this application is not used, only a maximum of four versions can be generated by only using the cyclic shift matrix for a cyclic shift, without changing construction, and no more versions can be supported.

An example in which Px is a cyclic shift matrix with an offset of N/4 is used. In each of Tu, $Tu^2, \ldots,$ and $Tu^{M-1}$, a row and a column corresponding to an information bit in U, so as to form a group of information bit transformation matrices: $Tu_A, Tu_A{}^2, \ldots, Tu_A{}^{M-1}$. The subscript A represents extracting a row and a column corresponding to an information bit from an information bit transformation matrix $Tu^m$, where $1 \leq m \leq M-1$.

During extraction of some rows and columns in the information bit transformation matrix $Tu^m$, it may be found that there are the following submatrices.

a 2×2 upper triangular matrix $$\begin{bmatrix} 1 & 1 \\ & 1 \end{bmatrix},$$

producing a maximum of two versions, a 3×3 upper triangular matrix $$\begin{bmatrix} 1 & 1 & 1 \\ & 1 & 1 \\ & & 1 \end{bmatrix},$$

producing a maximum of four versions, and a 4×4 upper triangular matrix $$\begin{bmatrix} 1 & 1 & 1 & 1 \\ & 1 & 1 & 1 \\ & & 1 & 1 \\ & & & 1 \end{bmatrix},$$

producing a maximum of four versions. A version means a to-be-sent units that may be generated through progressive interleaving of a to-be-encoded sequence. To-be-sent units of different versions are sent at different timing. A receive end can obtain timing information through quantities of times of interleaving that correspond to different versions, and may implement soft combination of to-be-sent units of different versions.

A solution provided in this embodiment of this application is as follows.

The foregoing third manner for determining Su is used as an example for description.

Application scenario 1: An offset of Px is N/2, and two transmission versions are supported.

A 2×2 upper triangular matrix is found in the information bit transformation matrix, a location index, in U, of a row of a largest row weight in the 2×2 upper triangular matrix is determined based on construction of the polar code, and an element that is in Su and that corresponds to the location index is set to 1.

Application scenario 2: An offset of Px is N/4, and four transmission versions are supported.

A 3×3 upper triangular matrix is found in the information bit transformation matrix, a location index, in U, of a row of a largest row weight in the 3×3 upper triangular matrix is determined based on construction of the polar code, and an element that is in Su and that corresponds to the location index is set to 1.

It should be noted that, when there are at least two 2×2 or 3×3 upper triangular matrices, at least one upper triangular matrix is selected to perform the foregoing operation. If only one upper triangular matrix is selected, an upper triangular matrix that is ranked first in the order of the polar code may be selected.

For example, there are four transmission versions, and it is equivalent to that U is multiplied by a transformation matrix Tu for zero times, one time, two times, and three times separately. In other words, U is multiplied by I, Tu, Tu^2, and Tu^3 separately, where I is an identity matrix. Rows and columns corresponding to an information bit location in U are extracted from the four matrices I, Tu, $T_u^2$, and $T_u^3$, and are respectively denoted as information bit transformation matrices I, $T_{uA}$, $T_{uA}^2$, and $T_{uA}^3$. An addition operation is performed on each row of the four information transformation matrices, to obtain a natural sequence location, in U, of a sequence number corresponding to a location of a largest row weight in these matrices, and a bit at the natural sequence number location in Su is set to 1.

A polar code corresponding to N=512 and K=40 is used as an example. An information bit is constructed by using a PW sequence. Through observation of the four matrices I, $T_{uA}$, $T_{uA}^2$, and $T_{uA}^3$, it can be learned that a first row of the matrix $T_{uA}^3$ has a largest row weight, and a sequence number of the first row in U is 256. In this case, Su(256)=1.

In this way, a confusion problem caused due to an all-0 vector can be resolved through a scrambling operation.

As described in the foregoing original solution, a structure of a 2×2 upper triangular matrix supports only two transmission versions without duplication, while a rest structure supports four transmission versions without duplication. Actually, a maximum quantity of transmission versions without duplication that can be supported depends on a maximum dimension of an upper triangular matrix that can be extracted from Tu. If one scrambling operation is introduced after the foregoing transformation, for example, scrambling "1" is introduced each time at a location corresponding to a row of a largest row weight in an upper triangular matrix, a structure of the foregoing 2×2 upper triangular matrix can support four transmission versions without duplication, and a structure of a 4×4 upper triangular matrix can support eight transmission versions without duplication.

The following describes in detail a manner for increasing a transmission version.

(1) Cyclic shift processing is performed on a polar codeword. This case only occurs in case of a high code rate.

A definition of a high code rate is that a bit at an $(N/4)^{th}$ location in U is an information bit. In this case, a row weight may be 4 in a transformation matrix of the information bit. In other words, there is a 4×4 upper triangular transformation matrix. A bit that is in Su and that corresponds to a location of a row in Tu is set to 1, where the row has a largest row weight in the 4×4 upper triangular transformation matrix.

An example in which a bit at an $(N/4)^{th}$ location in Su is set to 1 is used. An encoded bit sequence presents the following classical rule.

If U represents [a b c d], output eight transmission versions are shown in Table 1 and are respectively represented as #1 to #8. ⊗ represents an exclusive OR operation, in other words, a scrambling operation.

TABLE 1

| #1 | a | b | c | d |
|----|---|---|---|---|
| #2 | b | c | d | a ⊕ 1 |
| #3 | c | d | a ⊕ 1 | b ⊕ 1 |
| #4 | d | a ⊕ 1 | b ⊕ 1 | c ⊕ 1 |
| #5 | a ⊕ 1 | b ⊕ 1 | c ⊕ 1 | d ⊕ 1 |
| #6 | b ⊕ 1 | c ⊕ 1 | d ⊕ 1 | a |
| #7 | c ⊕ 1 | d ⊕ 1 | a | b |
| #8 | d ⊕ 1 | a | b | c |

A sequence number of an element that is in Su and that is set to 1 is less than or equal to N/4, and correspondingly, eight transmission versions can also be generated, and only specific forms are different from those in Table 1.

(2) A mother code length is d×N, to be specific, to-be-encoded sequences form d pails of an equal length, and U is any one of the d pails, where d is an exponential power of 2. For example, d is two, four, and eight. A same cyclic shift is performed on all parts. For a transformation matrix Tu corresponding to Px, an information bit transformation matrix is extracted from the transformation matrix Tu based on construction. A row whose row weight is greater than 4 in the information bit transformation matrix is found and a bit at a corresponding location in Su is set to 1.

For example, for a polar code corresponding to N=512 and K=40, it is assumed that d=8. If there is only one 4×4 upper triangular matrix in different information bit transformation matrices $Tu^m$, and a row of a largest row weight in the 4×4 upper triangular matrix is ranked tenth in the information bit transformation matrix and ranked $464^{th}$ in U correspondingly, a bit at the $464^{th}$ location in Su is set to 1.

When scrambling is performed, based on a solution in which an offset of Px is N/4, namely, based on a solution in which four cyclic shifts are performed, eight transmission versions can be generated, and only one set of rules is used for soft combination and blind detection performed by the receive end. Specific cases in which transmission versions are increased are shown in Table 2.

TABLE 2

| Maximum upper triangle transformation dimension | Quantity of versions supported by four cyclic shifts | Quantity of versions supported after progressive scrambling is introduced |
|---|---|---|
| 2 × 2 | 2 | 4 |
| 3 × 3 | 4 | 4 |
| 4 × 4 | 4 | 8 |
| 5 × 5 | 4 | 8 |
| 6 × 6 | 4 | 16 |

FIG. 16 is a schematic diagram of segmented cyclic shifts by a transmit end.

Figure 17:
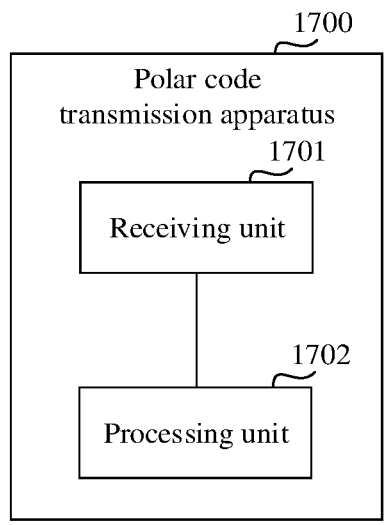
FIG. 17 is a schematic structural diagram 1 of a polar code transmission apparatus according to an embodiment of this application.

Based on a same invention concept as the polar code transmission method shown in FIG. 12, as shown in FIG. 17, an embodiment of this application further provides a polar code transmission apparatus 1700. The polar code transmission apparatus 1700 is configured to perform the polar code transmission method shown in FIG. 12, and includes a receiving unit 1701, configured to obtain some or all of to-be-encoded bit sequences U, and a processing unit 1702, configured to perform polar code encoding on the some or all of the to-be-encoded bit sequences U obtained by the receiving unit 1701, to generate an encoded sequence, where a length of U is N.

The processing unit 1702 is further configured to scramble and interleave the encoded sequence by using a scrambling sequence $S_X$ and an interleaving matrix $P_X$.

Optionally, a mother code length is N, and the length of U is the same as the mother code length.

If a bit at an $(N/2)^{th}$ location in U is an information bit, and a bit at an $(N/4)^{th}$ location in U is a fixed bit, bits at a first location to an $(N/2)^{th}$ location in $S_X$ are set to 1, or if a bit at an $(N/4)^{th}$ location in U is a fixed bit, and $S_X = S_U \cdot G_N$, where $G_N$ is a generator matrix of a polar code, and Su is a 1×N vector, a bit that is in Su and that corresponds to a first information bit location in U is set to 1, or if $S_X = S_U \cdot G_N$, and $G_N \cdot P_x \cdot G_N = T_u$, where $G_N$ is a generator matrix of a polar code, Su is a 1×N vector, and $T_u$ is a transformation matrix, column vectors that are in $T_u$ and that correspond to information bit locations in U constitute an information bit transformation matrix, and a bit that is in Su and that corresponds to a location of a row in Tu is set to 1, where the row has a largest row weight in an M×M upper triangular matrix in the information bit transformation matrix, and M is a positive integer greater than or equal to 2.

Optionally, a mother code length is d×N, the to-be-encoded sequences form d parts of an equal length, U is any one of the d parts, and d is an exponential power of 2, and if a bit at an $(N/2)^{th}$ location in U is an information bit, and a bit at an $(N/4)^{th}$ location in U is a fixed bit, a bit at an $(N/2)^{th}$ location in Su is set to 1, or if a bit at an $(N/4)^{th}$ location in U is a fixed bit, and $S_X = S_U \cdot G_N$, where $G_N$ is a generator matrix of a polar code, and Su is a 1×N vector, a bit that is in Su and that corresponds to a first information bit location in U is set to 1, or if $S_X = S_U \cdot G_N$, and $G_N \cdot P_x \cdot G_N = T_u$, $G_N$, where $G_N$ is a generator matrix of a polar code, Su is a 1×N vector, and $T_u$ is a transformation matrix, column vectors that are in $T_u$ and that correspond to information bit locations in U constitute an information bit transformation matrix, and a bit that is in Su and that corresponds to a location of a row in Tu is set to 1, where the row has a largest row weight in an M×M upper triangular matrix in the information bit transformation matrix, and M is a positive integer greater than or equal to 2.

Optionally, the processing unit 1702 is configured to first scramble and then interleave the encoded sequence, or first interleave and then scramble the encoded sequence.

Optionally, if there are at least two M×M upper triangular matrices in the information bit transformation matrix, a bit that is in Su and that corresponds to a location of a row in Tu is set to 1, where the row has a largest row weight in at least one M×M upper triangular matrix.

Optionally, the interleaving matrix includes a cyclic shift matrix.

Figure 18:
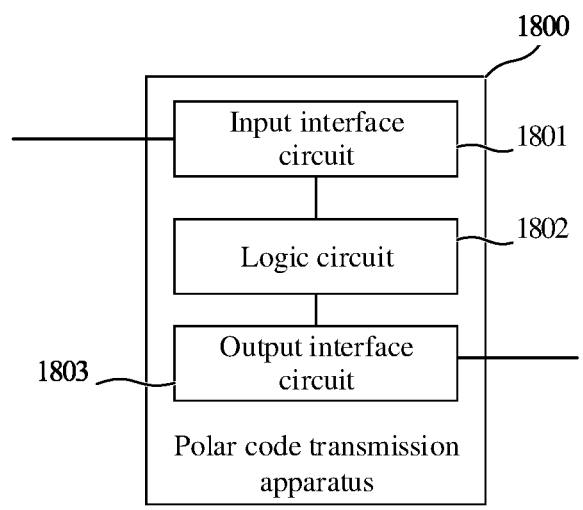
FIG. 18 is a schematic structural diagram 2 of a polar code transmission apparatus according to an embodiment of this application.

Based on a same invention concept as the polar code transmission method shown in FIG. 12, as shown in FIG. 18, an embodiment of this application further provides a polar code transmission apparatus 1800. The polar code transmission apparatus 1800 is configured to perform the polar code transmission method shown in FIG. 12. Some or all of the steps of the polar transmission method in the foregoing embodiment may be implemented by hardware, or may be implemented by software. When some or all of the steps are implemented by hardware, the polar code transmission apparatus 1800 includes an input interface circuit 1801, a logic circuit 1802, and an output interface circuit 1803. The input interface circuit 1801 is configured to obtain some or all of to-be-encoded bit sequences U. The logic circuit 1802 is configured to perform the polar code transmission method shown in FIG. 12. For details, refer to the descriptions of the foregoing method embodiment, and details are not described herein again. The output interface circuit 1803 is configured to output a scrambled and interleaved bit sequence.

Optionally, the polar code transmission apparatus 1800 may be a chip or an integrated circuit during specific implementation.

Figure 19:
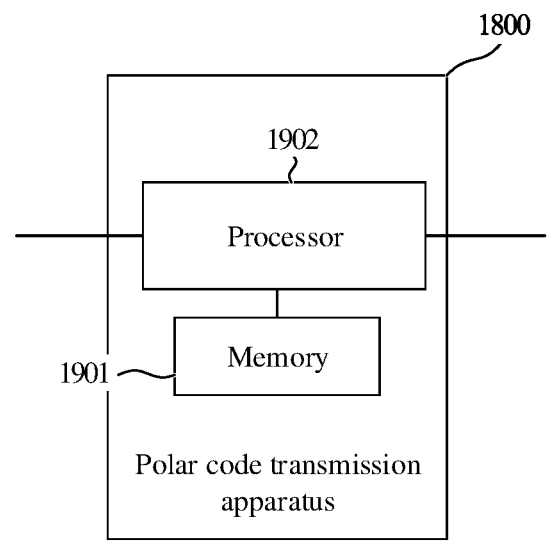
FIG. 19 is a schematic structural diagram 3 of a polar code transmission apparatus according to an embodiment of this application.

Optionally, when some or all of the steps of the polar transmission method in the foregoing embodiment are implemented by software, as shown in FIG. 19, the polar code transmission apparatus 1800 includes a memory 1901, configured to store a program, and a processor 1902, configured to execute the program stored in the memory 1901. When the program is executed, the polar code transmission apparatus 1800 can implement the polar code transmission method provided in the foregoing embodiment.

Figure 20:
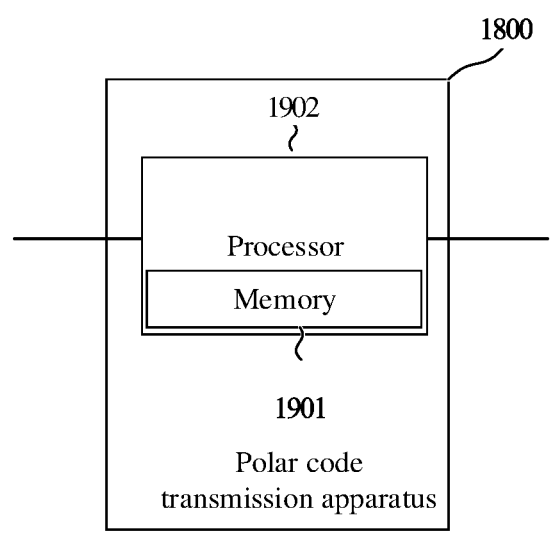
FIG. 20 is a schematic structural diagram 4 of a polar code transmission apparatus according to an embodiment of this application.

Optionally, the memory 1901 may be a physically independent unit. Alternatively, as shown in FIG. 20, the memory 1901 may be integrated with the processor 1902 together.

Optionally, when some or all of the steps of the polar code transmission method in the foregoing embodiment are implemented by software, the polar code transmission apparatus 1800 may alternatively include only the processor 1902. The memory 1901 configured to store a program is located outside the polar code transmission apparatus 1800, and the processor 1902 is connected to the memory 1901 through a circuit/an electric wire, and is configured to read and execute the program stored in the memory 1901.

An embodiment of this application provides a computer readable storage medium, configured to store a computer program. The computer program includes an instruction used to perform the polar code transmission method shown in FIG. 12.

An embodiment of this application provides a computer program product including an instruction. When the instruction runs on a computer, the computer is enabled to perform the polar code transmission method shown in FIG. 12.

Persons skilled in the art should understand that the embodiments of this application may be provided as a method, a system, or a computer program product. Therefore, this application may use a form of hardware only embodiments, software only embodiments, or embodiments with a combination of software and hardware. In addition, this application may use a form of a computer program product that is implemented on one or more computer-usable storage media (including but not limited to a disk memory, a CD-ROM, and an optical memory) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a special-purpose computer, an embedded processor, or a processor of any other programmable data processing device to generate a machine, so that the instructions executed by a computer or a processor of any other programmable data processing device generate an apparatus for implementing a specified function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specified function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

Although some embodiments of this application have been described, persons skilled in the art can make changes and modifications to these embodiments once they learn the basic inventive concept. Therefore, the following claims are intended to be construed as to cover the preferred embodiments and all changes and modifications falling within the scope of this application.

Obviously, persons skilled in the art can make various modifications and variations to the embodiments of this application without departing from the scope of the embodiments of this application. This application is intended to cover these modifications and variations provided that they fall within the scope of protection defined by the following claims and their equivalent technologies.

What is claimed is:

1. A polar code transmission method, comprising:
   performing, by a transmit end, polar code encoding on at least one of to-be-encoded bit sequences U to generate an encoded sequence, wherein a length of U is N; and
   scrambling and interleaving, by the transmit end, the encoded sequence by using a scrambling sequence Sx and an interleaving matrix $P_x$, wherein a mother code length is d×N, wherein the to-be-encoded bit sequences form d parts of an equal length, wherein U is any one of the d parts, and wherein d is an exponential power of 2; and
   performing at least one of:
      setting a bit at an $(N/4)^{th}$ location in Su to 1 in response to a bit at an $(N/2)^{th}$ location in U being an information bit, and further in response to a bit at an $(N/4)^{th}$ location in U being a fixed bit; or
      setting a bit that is in Su and that corresponds to a first information bit location in U to 1 in response to a bit at an $(N/4)^{th}$ location in U being a fixed bit, and further in response to $S_x=S_u \cdot G_N$, wherein $G_N$ is a generator matrix of a polar code, and wherein Su is a 1×N vector; or
      setting a bit that is in Su and that corresponds to a location of a row in Tu to 1 in response to $S_x=S_u \cdot G_N$, and $G_N \cdot P_x \cdot G_N = T_u$, wherein $G_N$ is a generator matrix of a polar code, Su is a 1×N vector, and $T_u$ is a transformation matrix, wherein column vectors that are in $T_u$, and that correspond to information bit locations in U constitute an information bit transformation matrix, wherein the row has a largest row weight in an M×M upper triangular matrix in the information bit transformation matrix, and wherein M is a positive integer greater than or equal to 2.

2. The method according to claim 1, wherein a mother code length is N, and wherein the length of U is the same as the mother code length.

3. The method according to claim 1, further comprising setting a bit that is in Su and that corresponds to a location of a row in Tu to 1 in response to at least two M×M upper triangular matrices being in the information bit transformation matrix, wherein the row has a largest row weight in at least one M×M upper triangular matrix.

4. The method according to claim 1, wherein the scrambling and interleaving, by the transmit end, the encoded sequence comprises performing at least one of:
   first scrambling and then interleaving, by the transmit end, the encoded sequence; or
   first interleaving and then scrambling, by the transmit end, the encoded sequence.

5. The method according to claim 1, wherein the interleaving matrix comprises a cyclic shift matrix.

6. The method according to claim 5, wherein interleaving matrix has an offset of N/4.

7. A polar code transmission apparatus, comprising:
   a processor; and
   a non-transitory computer-readable storage medium storing a program to be executed by the processor, the program including instructions to:
      obtain at least one of to-be-encoded bit sequences U;
      perform polar code encoding on the at least one of the to-be-encoded bit sequences U to generate an encoded sequence, wherein a length of U is N; and
      scramble and interleave the encoded sequence by using a scrambling sequence $S_x$ and an interleaving matrix $P_x$, wherein a mother code length is d×N, wherein the to-be-encoded bit sequences form d parts of an equal length, wherein U is any one of the d parts, and wherein d is an exponential power of 2; and
   perform at least one of:
      set a bit at an $(N/2)^{th}$ location in Su to 1 in response to a bit at an $(N/2)^{th}$ location in U being an information bit, and further in response to a bit at an $(N/4)_{th}$ location in U being a fixed bit: or
      set a bit that is in Su and that corresponds to a first information bit location in U to 1 in response to a bit at an $(N/4)_{th}$ location in U being a fixed bit, and further in response to $S_x=S_u \cdot G_N$, wherein $G_N$ is a generator matrix of a polar code, and wherein Su is a 1×N vector; or
      set a bit that is in Su and that corresponds to a location of a row in Tu to 1 in response to $S_x=S_u \cdot G_N$, and $G_N \cdot P_x \cdot G_N = T_u$, wherein $G_N$ is a generator matrix of a polar code, Su is a 1×N vector, and $T_u$ is a transformation matrix, wherein column vectors that are in $T_u$, and that correspond to information bit locations in U constitute an information bit transformation matrix, wherein the row has a largest row weight in an M×M upper triangular matrix in the information bit transformation matrix, and wherein M is a positive integer greater than or equal to 2.

8. The apparatus according to claim 7, wherein a mother code length is N, and wherein the length of U is the same as the mother code length.

9. The apparatus according to claim 7, further comprising setting a bit that is in Su and that corresponds to a location of a row in Tu to 1 in response to at least two M×M upper triangular matrices being in the information bit transformation matrix, wherein the row has a largest row weight in at least one M×M upper triangular matrix.

10. The apparatus according to claim 7, wherein the instructions to scramble and interleave the encoded sequence by using a scrambling sequence $S_x$ and an interleaving matrix $P_x$ include instructions to perform at least one of:
first scrambling and then interleaving the encoded sequence; or
first interleaving and then scrambling the encoded sequence.

11. The apparatus according to claim 7, wherein the interleaving matrix comprises a cyclic shift matrix.

12. The apparatus according to claim 11, wherein interleaving matrix has an offset of N/4.

13. A non-transitory computer readable storage medium storing computer readable instructions that, when run in an apparatus, cause the apparatus to:
obtain at least one of to-be-encoded bit sequences U;
perform polar code encoding on the at least one of the to-be-encoded bit sequences U to generate an encoded sequence, wherein a length of U is N; and
scramble and interleave the encoded sequence by using a scrambling sequence $S_x$ and an interleaving matrix $P_x$, wherein a mother code length is d×N, wherein the to-be-encoded bit sequences form d parts of an equal length, wherein U is any one of the d parts, and wherein d is an exponential power of 2; and
perform at least one of:
set a bit at an $(N/2)^{th}$ location in $S_u$ to 1 in response to a bit at an $(N/2)^{th}$ location in U being an information bit, and further in response to a bit at an $(N/4)_{th}$ location in U being a fixed bit; or
set a bit that is in Su and that corresponds to a first information bit location in U to 1 in response to a bit at an $(N/4)^{th}$ location in U being a fixed bit, and further in response to $S_x=S_u \cdot G_N$, wherein $G_N$ is a generator matrix of a polar code, and wherein Su is a 1×N vector; or
set a bit that is in Su and that corresponds to a location of a row in Tu to 1 in response to $S_x=S_u \cdot G_N$, and $G_N \cdot P_x \cdot G_N = T_u$, wherein $G_N$ is a generator matrix of a polar code, $S_u$ is a 1×N vector, and $T_u$ is a transformation matrix, wherein column vectors that are in $T_u$, and that correspond to information bit locations in U constitute an information bit transformation matrix,-wherein the row has a largest row weight in an M×M upper triangular matrix in the information bit transformation matrix, and wherein M is a positive integer greater than or equal to 2.

14. The computer readable storage medium according to claim 13, wherein a mother code length is N, and wherein the length of U is the same as the mother code length.

15. The computer readable storage medium according to claim 13, wherein the instructions, when run in the apparatus, further cause the apparatus to set a bit that is in $S_u$ and that corresponds to a location of a row in Tu to 1 in response to at least two M×M upper triangular matrices being in the information bit transformation matrix, wherein the row has a largest row weight in at least one M×M upper triangular matrix.

16. The computer readable storage medium according to claim 13, wherein the instructions that cause the apparatus to scramble and interleave the encoded sequence by using a scrambling sequence Sx and an interleaving matrix $P_x$ include instructions that, when run in the apparatus, further cause the apparatus to perform at least one of:
first scrambling and then interleaving the encoded sequence; or
first interleaving and then scrambling the encoded sequence.

17. The computer readable storage medium according to claim 13, wherein the interleaving matrix comprises a cyclic shift matrix.

* * * * *